US012745452B2

(12) United States Patent
Kim et al.

(10) Patent No.: US 12,745,452 B2
(45) Date of Patent: Sep. 22, 2026

(54) SEMICONDUCTOR DEVICE INCLUDING SOURCE/DRAIN PATTERN WITH MAIN LAYER AND BUFFER LAYER HAVING GERMANIUM AND METHOD OF FABRICATING THE SAME

(71) Applicant: SAMSUNG ELECTRONICS CO., LTD., Suwon-si (KR)

(72) Inventors: Jinbum Kim, Suwon-si (KR); Gyeom Kim, Suwon-si (KR); Youngkwang Kim, Suwon-si (KR); Chanyoung Kim, Suwon-si (KR); Jangwoo Park, Suwon-si (KR); Sangmoon Lee, Suwon-si (KR); Sujin Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 473 days.

(21) Appl. No.: 18/227,064

(22) Filed: Jul. 27, 2023

(65) Prior Publication Data

US 2024/0203989 A1 Jun. 20, 2024

(30) Foreign Application Priority Data

Dec. 14, 2022 (KR) ........................ 10-2022-0174653

(51) Int. Cl.

| | |
|---|---|
| ***H10D 84/85*** | (2025.01) |
| ***H10D 30/43*** | (2025.01) |
| ***H10D 30/67*** | (2025.01) |
| ***H10D 62/10*** | (2025.01) |
| ***H10D 62/13*** | (2025.01) |

(Continued)

(52) U.S. Cl.

CPC ............. *H10D 84/85* (2025.01); *H10D 30/43* (2025.01); *H10D 30/6735* (2025.01); (Continued)

(58) Field of Classification Search

CPC ............... H01D 30/501; H01D 30/502; H01D 30/6735; H01D 30/503; H01D 30/504; (Continued)

(56) References Cited

U.S. PATENT DOCUMENTS

| | | |
|---|---|---|
| 8,377,754 B1 | 2/2013 | Campi, Jr. et al. |
| 11,195,954 B2 | 12/2021 | Cho et al. |

(Continued)

FOREIGN PATENT DOCUMENTS

| | | |
|---|---|---|
| KR | 10-2019-0078818 A | 7/2019 |
| KR | 10-2020-0136133 A | 12/2020 |
| KR | 10-2022-0021850 A | 2/2022 |

*Primary Examiner* — Caleen O Sullivan
*Assistant Examiner* — Brett Squires
(74) *Attorney, Agent, or Firm* — Sughrue Mion, PLLC

(57) ABSTRACT

A semiconductor device includes a substrate including a p-type metal-oxide-semiconductor (MOS) field-effect transistor (FET) (PMOSFET) region and an n-type MOSFET (NMOSFET) region, a first active pattern on the PMOSFET region, a second active pattern on the NMOSFET region, a first channel pattern and a first source/drain pattern on the first active pattern, the first channel pattern connected to the first source/drain pattern, a second channel pattern and a second source/drain pattern provided on the second active pattern, the second channel pattern connected to the second source/drain pattern, and a gate electrode on the first channel pattern and the second channel pattern.

14 Claims, 33 Drawing Sheets

(51) Int. Cl.
*H10D 62/40* (2025.01)
*H10D 62/832* (2025.01)
*H10D 64/23* (2025.01)

(52) U.S. Cl.
CPC ......... *H10D 62/121* (2025.01); *H10D 62/151* (2025.01); *H10D 62/405* (2025.01); *H10D 62/832* (2025.01); *H10D 64/258* (2025.01)

(58) Field of Classification Search
CPC .. H01D 30/505; H01D 30/506; H01D 30/507; H01D 30/508; H01D 30/509; H10D 64/251; H10D 64/256; H10D 64/258; H10D 30/6735; H10D 84/85; H10D 62/121; H10D 62/151; H10D 62/405; H10D 62/832; H10D 30/43; H10D 30/435
See application file for complete search history.

(56) References Cited

U.S. PATENT DOCUMENTS

| | | | | |
|---|---|---|---|---|
| 2019/0198639 | A1 | 6/2019 | Kim et al. | |
| 2021/0035870 | A1 | 2/2021 | Young et al. | |
| 2021/0328020 | A1 | 10/2021 | Chung et al. | |
| 2021/0335709 | A1* | 10/2021 | Wang | H10D 30/014 |
| 2021/0367036 | A1 | 11/2021 | Kim et al. | |
| 2022/0052203 | A1 | 2/2022 | More | |
| 2022/0069135 | A1 | 3/2022 | Chu et al. | |
| 2022/0238713 | A1* | 7/2022 | Lee | H10D 86/0214 |
| 2022/0367622 | A1* | 11/2022 | Lin | H10D 84/0167 |
| 2023/0178653 | A1* | 6/2023 | Mochizuki | H10D 62/151 257/401 |
| 2023/0197855 | A1* | 6/2023 | Hasan | H10D 30/6735 257/347 |

* cited by examiner

SEMICONDUCTOR DEVICE INCLUDING SOURCE/DRAIN PATTERN WITH MAIN LAYER AND BUFFER LAYER HAVING GERMANIUM AND METHOD OF FABRICATING THE SAME

CROSS-REFERENCE TO RELATED APPLICATIONS

This application is based on and claims priority to Korean Patent Application No. 10-2022-0174653, filed on Dec. 14, 2022, in the Korean Intellectual Property Office, the disclosure of which is incorporated herein by reference in its entirety.

BACKGROUND

1. Field

Example embodiments of the disclosure relate to a semiconductor device and a method of fabricating the same, and in particular, to a semiconductor device including a field effect transistor and a method of fabricating the same.

2. Description of Related Art

A semiconductor device may include an integrated circuit including metal-oxide-semiconductor field-effect transistors (MOSFETs). To meet an increasing demand for a semiconductor device with a small pattern size and a reduced design rule, the MOSFETs are being scaled down. The scale-down of the MOSFETs may lead to deterioration in operational properties of the semiconductor device. In the related art, studies are being conducted to overcome technical limitations associated with the scale-down of the semiconductor device and to realize the semiconductor devices with high performance.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public

SUMMARY

One or more example embodiments provide a semiconductor device and a method of fabricating a semiconductor device with improved electrical and reliability characteristics.

Additional aspects will be set forth in part in the description which follows and, in part, will be apparent from the description, or may be learned by practice of the presented embodiments.

According to an aspect of an example embodiment, a semiconductor device may include a substrate including a p-type metal-oxide-semiconductor (MOS) field-effect transistor (FET) (PMOSFET) region and an n-type MOSFET (NMOSFET) region, a first active pattern on the PMOSFET region, a second active pattern on the NMOSFET region, a first channel pattern and a first source/drain pattern on the first active pattern, the first channel pattern connected to the first source/drain pattern, a second channel pattern and a second source/drain pattern provided on the second active pattern, the second channel pattern connected to the second source/drain pattern, and a gate electrode on the first channel pattern and the second channel pattern, where the first source/drain pattern may include a first buffer layer and a first main layer on the first buffer layer, the second source/drain pattern may include a second buffer layer and a second main layer on the second buffer layer, each of the first buffer layer and the second buffer layer may include silicon-germanium (SiGe), and a germanium concentration in each of the first buffer layer and the second buffer layer may be in a range from 2 at % to 30 at %.

According to an aspect of an example embodiment, a semiconductor device may include a substrate including a PMOSFET region and an NMOSFET region, a first active pattern on the PMOSFET region, a second active pattern on the NMOSFET region, a first channel pattern and a first source/drain pattern on the first active pattern, the first channel pattern connected to the first source/drain pattern, a second channel pattern and a second source/drain pattern on the second active pattern, the second channel pattern connected to the second source/drain pattern, a gate electrode on the first channel pattern and the second channel pattern, a gate insulating layer between the gate electrode and each of the first and second channel patterns, and a gate spacer on a side surface of the gate electrode, where the gate spacer may include a first spacer, a second spacer, and a third spacer, the first spacer may contact the gate insulating layer, the second spacer may be between the first spacer and the third spacer, the first source/drain pattern may include a first buffer layer and a first main layer on the first buffer layer, the second source/drain pattern may include a second buffer layer and a second main layer on the second buffer layer, a first upper side surface of the first buffer layer may be vertically aligned to a side surface of the first spacer, and a second upper side surface of the second buffer layer may be vertically aligned to the side surface of the first spacer.

According to an aspect of an example embodiment, a semiconductor device may include a substrate including an NMOSFET region, an active pattern on the NMOSFET region, a channel pattern on the active pattern, the channel pattern including a plurality of semiconductor patterns spaced apart from each other, a source/drain pattern on the active pattern, a gate electrode on the channel pattern, the gate electrode including an inner electrode between adjacent semiconductor patterns of the plurality of semiconductor patterns and an outer electrode on a uppermost semiconductor pattern of the plurality of semiconductor patterns, a gate insulating layer between the gate electrode and each of the first and second channel patterns, a gate spacer on a side surface of the outer electrode, a gate capping pattern on a top surface of the outer electrode, an interlayer insulating layer on the gate capping pattern and the source/drain pattern, a gate contact penetrating the interlayer insulating layer and the gate capping pattern, the gate contact connected to the gate electrode, an active contact penetrating the interlayer insulating layer and connected to the source/drain pattern, a first metal layer on the interlayer insulating layer, the first metal layer including a plurality of first interconnection lines respectively connected to the gate contact and the active contact, and a second metal layer on the first metal layer, where the source/drain pattern may include a buffer layer and a main layer on the buffer layer, the main layer may include an upper portion may include at least one facet surface, the at least one facet surface is a {111} plane and the buffer layer may at least partially cover the at least one facet surface.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
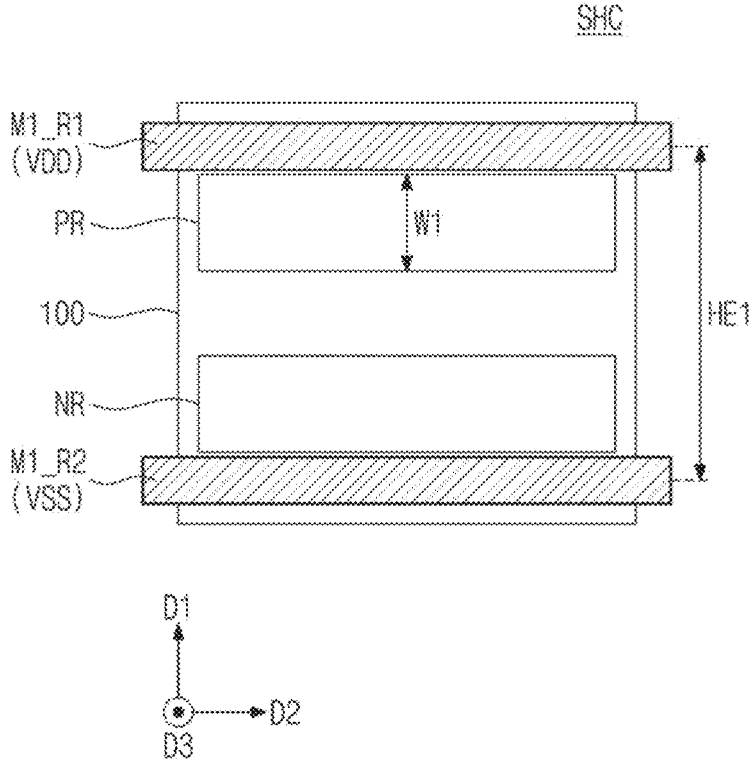
FIGS. 1, 2 and 3 are diagrams illustrating logic cells of a semiconductor device according to an embodiment of the disclosure.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 2:
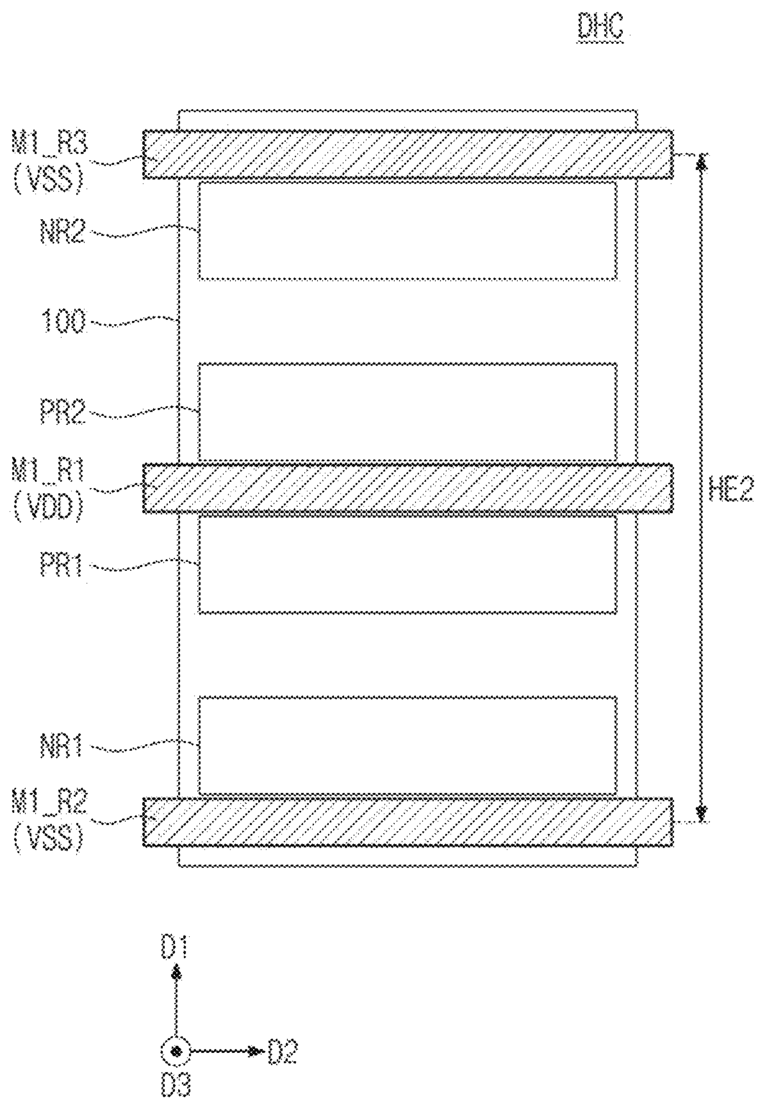
Figure 3:
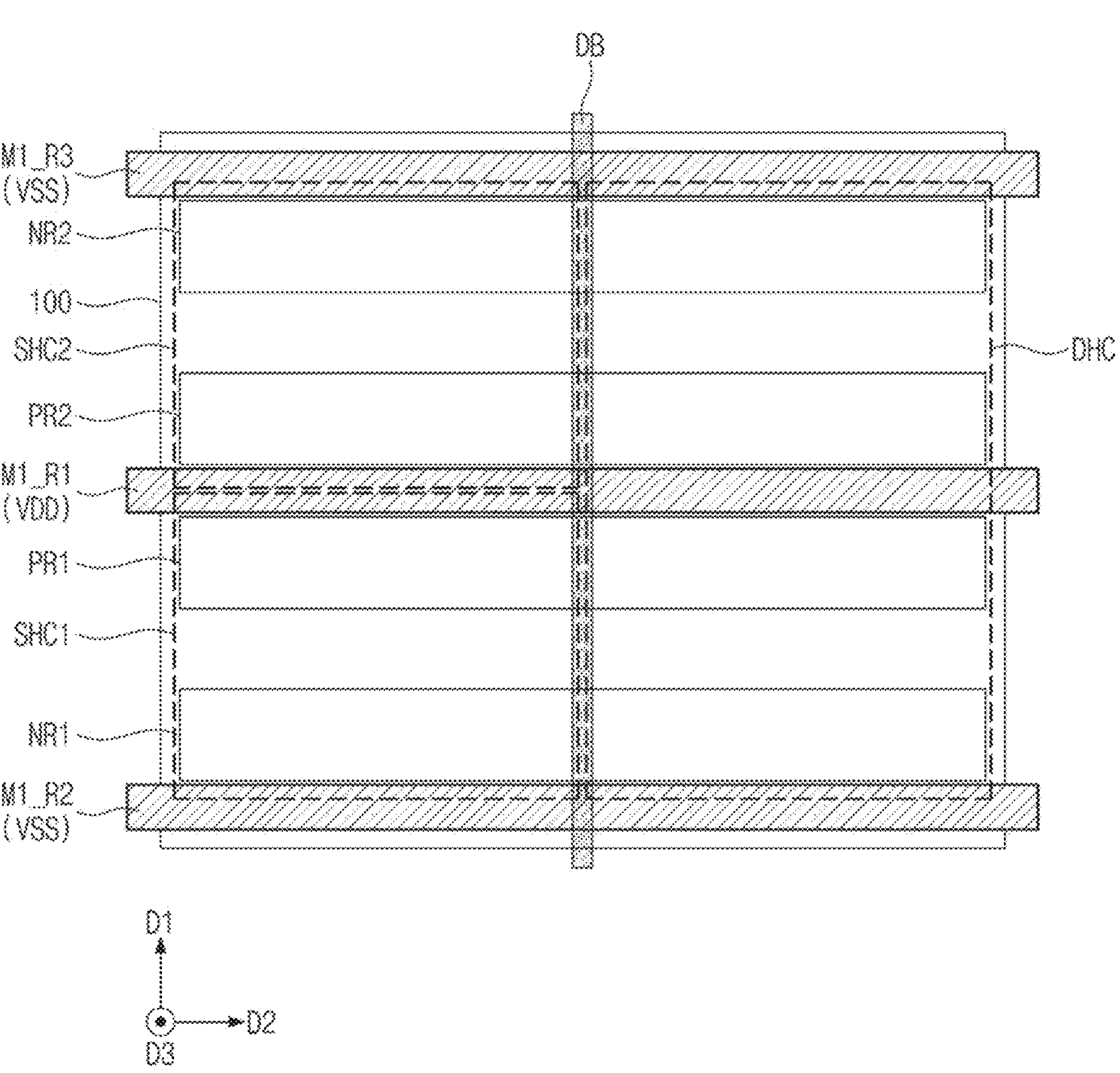

FIGS. 1, 2 and 3 are diagrams illustrating logic cells of a semiconductor device according to an embodiment of the disclosure.

Referring to FIG. 1, a single height cell SHC may be provided. A first power line M1_R1 and a second power line M1_R2 may be provided on a substrate 100. The first power line M1_R1 may be a conduction path, to which a drain voltage VDD (e.g., a power voltage) is provided. The second power line M1_R2 may be a conduction path, to which a source voltage VSS (e.g., a ground voltage) is provided.

The single height cell SHC may be defined between the first power line M1_R1 and the second power line M1_R2. The single height cell SHC may include one p-type metal-oxide-semiconductor (MOS) field-effect transistor (FET) (PMOSFET) region PR and one n-type MOSFET (NMOSFET) region NR. In other words, the single height cell SHC may have a complementary MOS (CMOS) structure provided between the first and second power lines M1_R1 and M1_R2.

Each of the PMOSFET and NMOSFET regions PR and NR may have a first width W1 in a first direction D1. A length of the single height cell SHC in the first direction D1 may be defined as a first height HE1. The first height HE1 may be substantially equal to a distance (e.g., a pitch) between the first and second power lines M1_R1 and M1_R2.

The single height cell SHC may constitute a single logic cell. In the disclosure, the logic cell may refer to a logic device (e.g., AND, OR, XOR, XNOR, inverter, etc.), which may be configured to execute a specific function. In other words, the logic cell may include transistors constituting the logic device and interconnection lines connecting transistors to each other.

Referring to FIG. 2, a double height cell DHC may be provided. The first power line M1_R1, the second power line M1_R2, and a third power line M1_R3 may be provided on the substrate 100. The first power line M1_R1 may be disposed between the second power line M1_R2 and the third power line M1_R3. The third power line M1_R3 may be a conduction path, to which the source voltage VSS is provided.

The double height cell DHC may be defined between the second power line M1_R2 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be adjacent to the second power line M1_R2. The second NMOSFET region NR2 may be adjacent to the third power line M1_R3. The first and second PMOSFET regions PR1 and PR2 may be adjacent to the first power line M1_R1. In a plan view, the first power line M1_R1 may be disposed between the first and second PMOSFET regions PR1 and PR2.

A length of the double height cell DHC in the first direction D1 may be defined as a second height HE2. The second height HE2 may be about two times the first height HE1 of FIG. 1. The first and second PMOSFET regions PR1 and PR2 of the double height cell DHC may be combined to serve as a single PMOSFET region.

Thus, a channel size of a p-type MOS (PMOS) transistor of the double height cell DHC may be greater than a channel size of a PMOS transistor of the single height cell SHC previously described with reference to FIG. 1. For example, the channel size of the PMOS transistor of the double height cell DHC may be about two times the channel size of the PMOS transistor of the single height cell SHC. In this case, the double height cell DHC may be operated at a higher speed than the single height cell SHC. In an embodiment, the double height cell DHC shown in FIG. 2 may be defined as a multi-height cell. The multi-height cell may include a triple height cell with a cell height about three times that of the single height cell SHC.

Referring to FIG. 3, a first single height cell SHC1, a second single height cell SHC2, and the double height cell DHC may be two-dimensionally disposed on the substrate 100. The first single height cell SHC1 may be disposed between the first and second power lines M1_R1 and M1_R2. The second single height cell SHC2 may be disposed between the first and third power lines M1_R1 and M1_R3. The second single height cell SHC2 may be adjacent to the first single height cell SHC1 in the first direction D1.

The double height cell DHC may be disposed between the second and third power lines M1_R2 and M1_R3. The double height cell DHC may be adjacent to the first and second single height cells SHC1 and SHC2 in a second direction D2.

A division structure DB may be provided between the first single height cell SHC1 and the double height cell DHC and between the second single height cell SHC2 and the double height cell DHC. The active region of the double height cell DHC may be electrically separated from the active region of each of the first and second single height cells SHC1 and SHC2 by the division structure DB.

Figure 4:
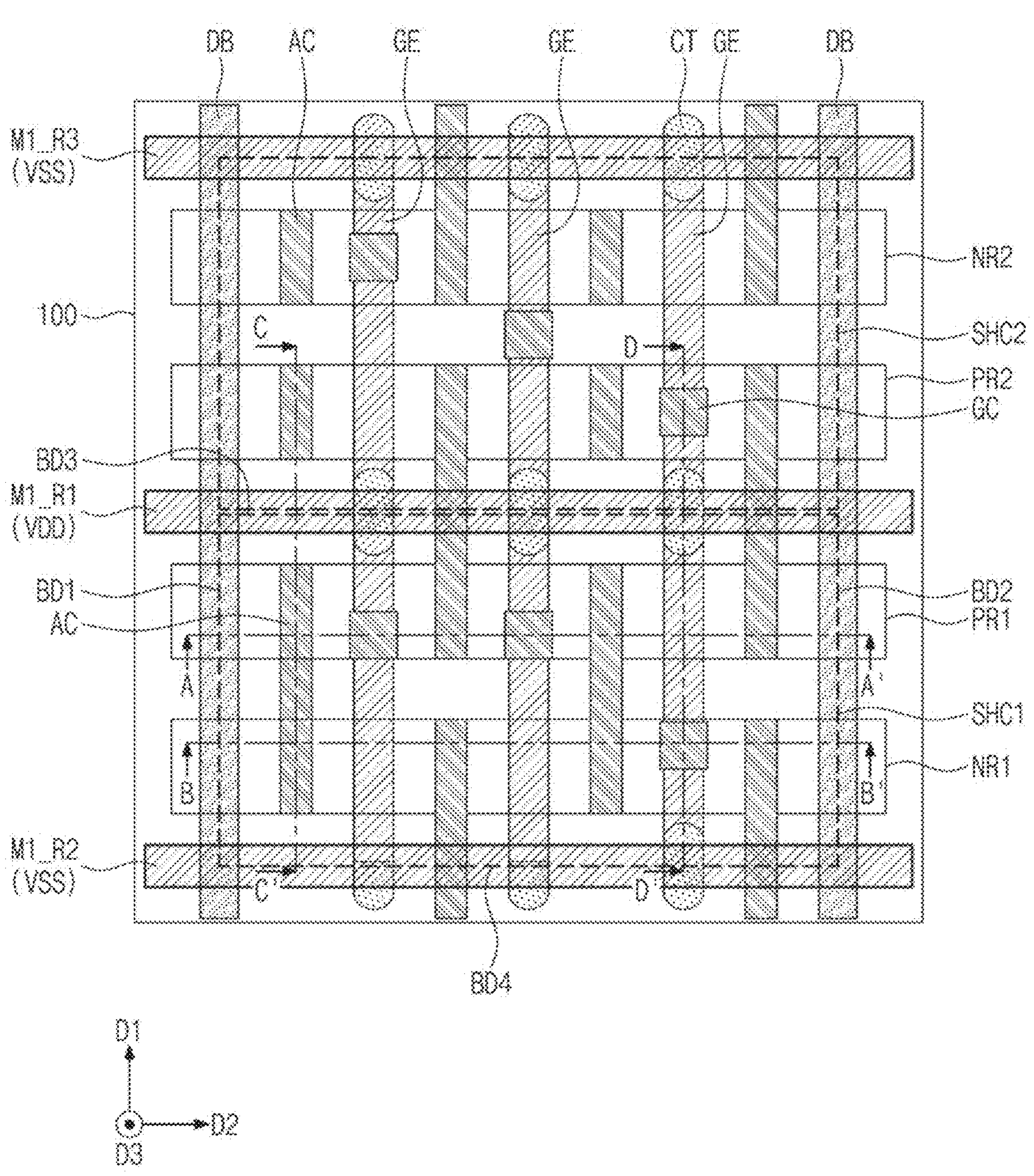
FIG. 4 is a plan view illustrating a semiconductor device according to an embodiment of the disclosure.

FIG. 4 is a plan view illustrating a semiconductor device according to an embodiment of the disclosure. FIGS. 5A, 5B, 5C and 5D are cross-sectional views taken along lines A-A', B-B', C-C', and D-D', respectively, of FIG. 4, according to an embodiment of the disclosure.

Referring to FIGS. 4 and 5A to 5D, the first and second single height cells SHC1 and SHC2 may be provided on the substrate 100. Logic transistors constituting the logic circuit may be disposed on each of the first and second single height cells SHC1 and SHC2. The substrate 100 may be a semiconductor substrate that is formed of or includes silicon (Si), germanium (Ge), silicon germanium (SiGe), a compound semiconductor material, or the like. In an embodiment, the substrate 100 may be a silicon wafer.

The substrate 100 may include a first PMOSFET region PR1, a second PMOSFET region PR2, a first NMOSFET region NR1, and a second NMOSFET region NR2. Each of the first PMOSFET region PR1, the second PMOSFET region PR2, the first NMOSFET region NR1, and the second NMOSFET region NR2 may extend in the second direction D2. The first single height cell SHC1 may include the first NMOSFET region NR1 and the first PMOSFET region PR1, and the second single height cell SHC2 may include the second PMOSFET region PR2 and the second NMOSFET region NR2.

A first active pattern AP1 and a second active pattern AP2 may be defined by a trench TR, which is formed in an upper portion of the substrate 100. The first active pattern AP1 may be provided on each of the first and second PMOSFET regions PR1 and PR2. The second active pattern AP2 may be provided on each of the first and second NMOSFET regions NR1 and NR2. The first and second active patterns AP1 and AP2 may extend in the second direction D2. Each of the first and second active patterns AP1 and AP2 may be a vertically-protruding portion of the substrate 100.

A device isolation layer ST may be provided to fill the trench TR. The device isolation layer ST may include a silicon oxide layer. The device isolation layer ST may not cover or may only partially cover first and second channel patterns CH1 and CH2 to be described below.

The first channel pattern CH1 may be provided on the first active pattern AP1. The second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which may be sequentially stacked. The first to third semiconductor patterns SP1, SP2, and SP3 may be spaced apart from each other in a vertical direction (i.e., a third direction D3).

Each of the first to third semiconductor patterns SP1, SP2, and SP3 may be formed of or include at least one of silicon (Si), germanium (Ge), or silicon germanium (SiGe). In an embodiment, each of the first to third semiconductor patterns SP1, SP2, and SP3 may be formed of or include crystalline silicon. The first to third semiconductor patterns SP1, SP2, and SP3 may be stacked nanosheets.

A plurality of first source/drain patterns SD1 may be provided on the first active pattern AP1. A plurality of first recesses RS1 may be formed in an upper portion of the first active pattern AP1. The first source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. In other words, each pair of the first source/drain patterns SD1 may be connected to each other by the stacked first to third semiconductor patterns SP1, SP2, and SP3.

A plurality of second source/drain patterns SD2 may be provided on the second active pattern AP2. A plurality of second recesses RS2 may be formed in an upper portion of the second active pattern AP2. The second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2. In other words, each pair of the second source/drain patterns SD2 may be connected to each other by the stacked first to third semiconductor patterns SP1, SP2, and SP3.

The first and second source/drain patterns SD1 and SD2 may be epitaxial patterns, which are formed by a selective epitaxial growth (SEG) process. In an embodiment, a top surface of each of the first and second source/drain patterns SD1 and SD2 may be located at substantially the same level as a top surface of the third semiconductor pattern SP3. In another embodiment, the top surface of at least one of the first and second source/drain patterns SD1 and SD2 may be higher than the top surface of the third semiconductor pattern SP3.

The first source/drain patterns SD1 may include a semiconductor material (e.g., SiGe) having a lattice constant greater than that of the substrate 100. In this case, the pair of the first source/drain patterns SD1 may exert a compressive stress on the first channel patterns CH1 therebetween. The second source/drain patterns SD2 may be formed of or include the same semiconductor element (e.g., Si) as the substrate 100. The first and second source/drain patterns SD1 and SD2 will be described in more detail with reference to FIGS. 6A and 6B.

Referring to FIGS. 4 and 5A to 5D, gate electrodes GE may be provided to cross the first and second channel patterns CH1 and CH2 and to extend in the first direction D1. The gate electrodes GE may be arranged at a first pitch in the second direction D2. Each of the gate electrodes GE may be vertically overlapped with the first and second channel patterns CH1 and CH2.

Each gate electrode GE may include a first inner electrode PO1 interposed between the active pattern AP1 or AP2 and the first semiconductor pattern SP1, a second inner electrode PO2 interposed between the first and second semiconductor patterns SP1 and SP2, a third inner electrode PO3 interposed between the second and third semiconductor patterns SP2 and SP3, and an outer electrode PO4 on the third semiconductor pattern SP3.

Figure 5A:
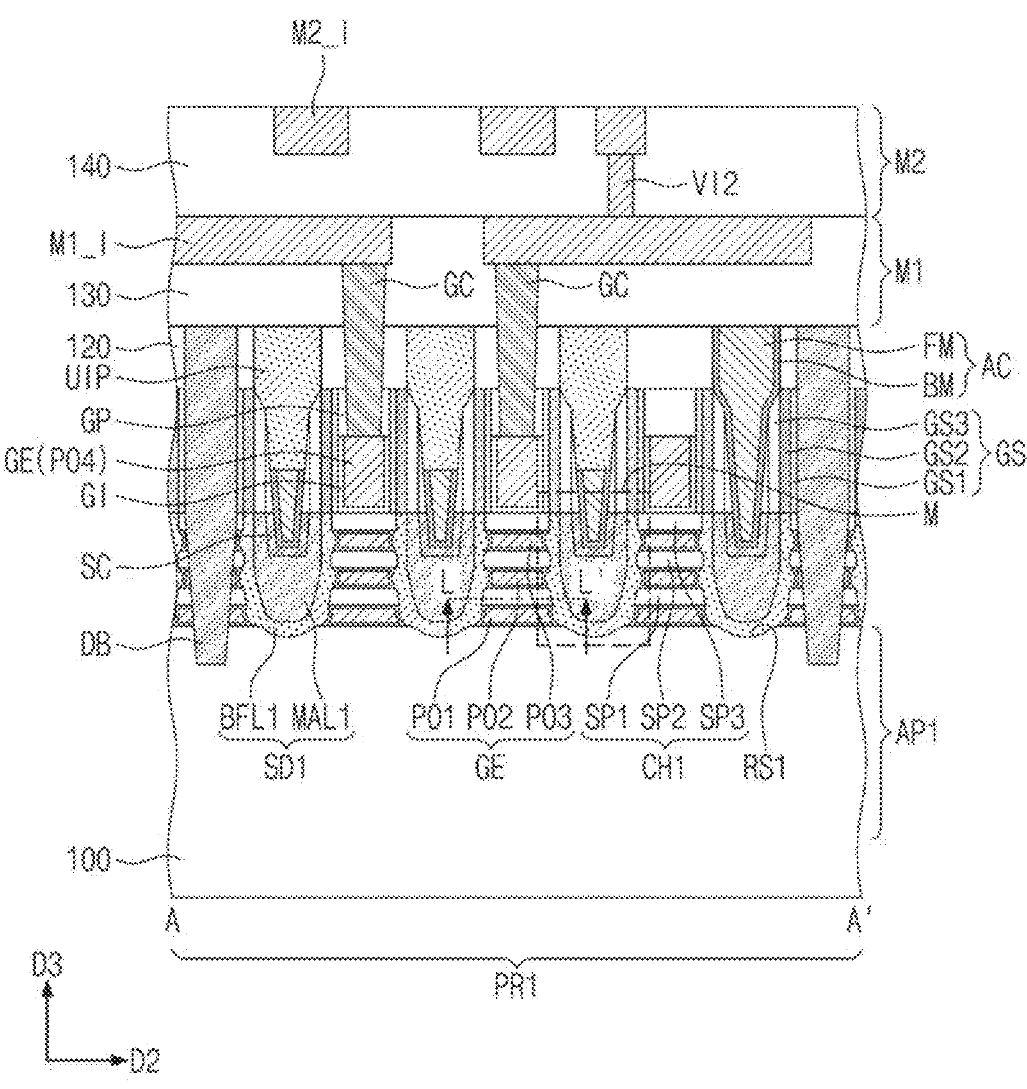
FIGS. 5A, 5B, 5C and 5D are cross-sectional views taken along lines A-A', B-B', C-C', and D-D', respectively, of FIG. 4, according to an embodiment of the disclosure.
Figure 5B:
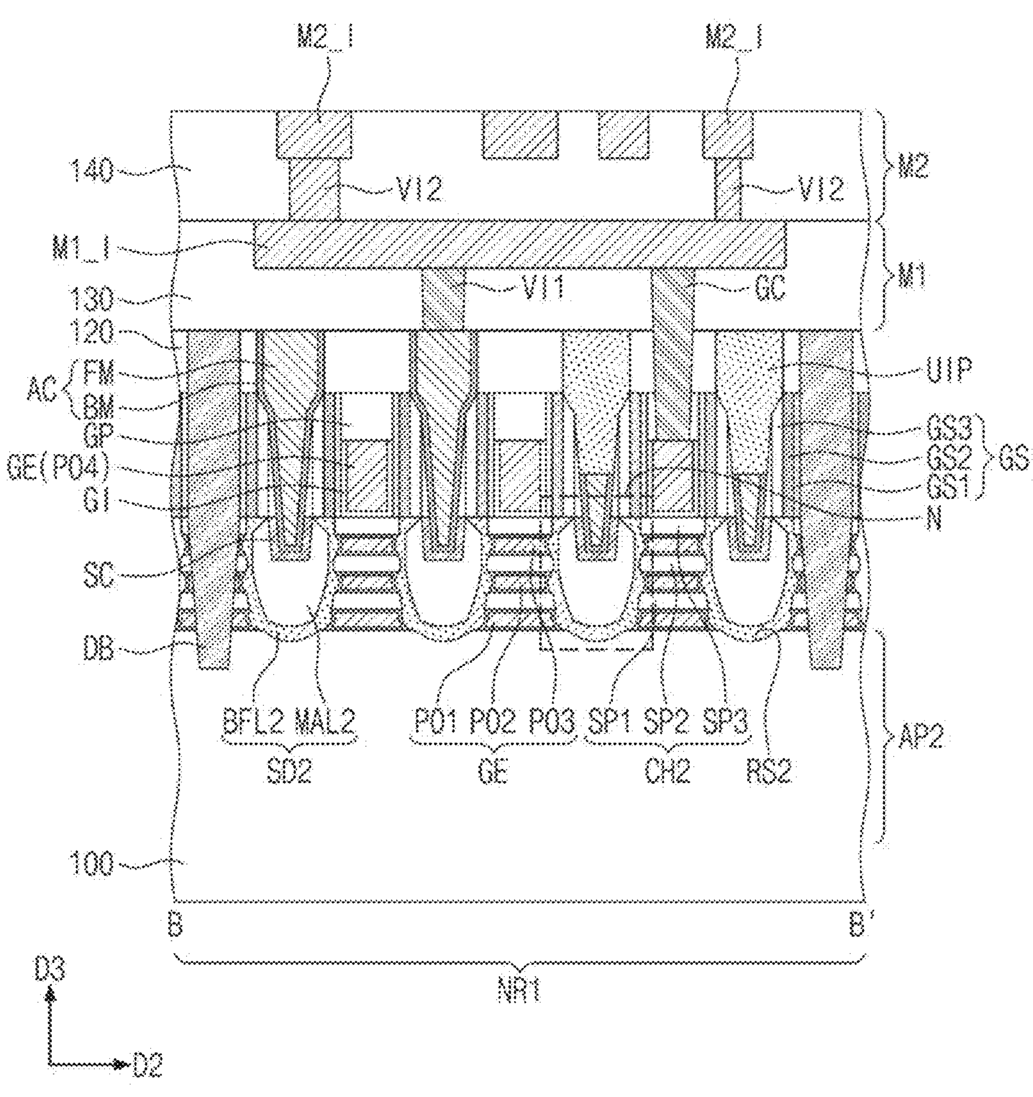
Figure 5C:
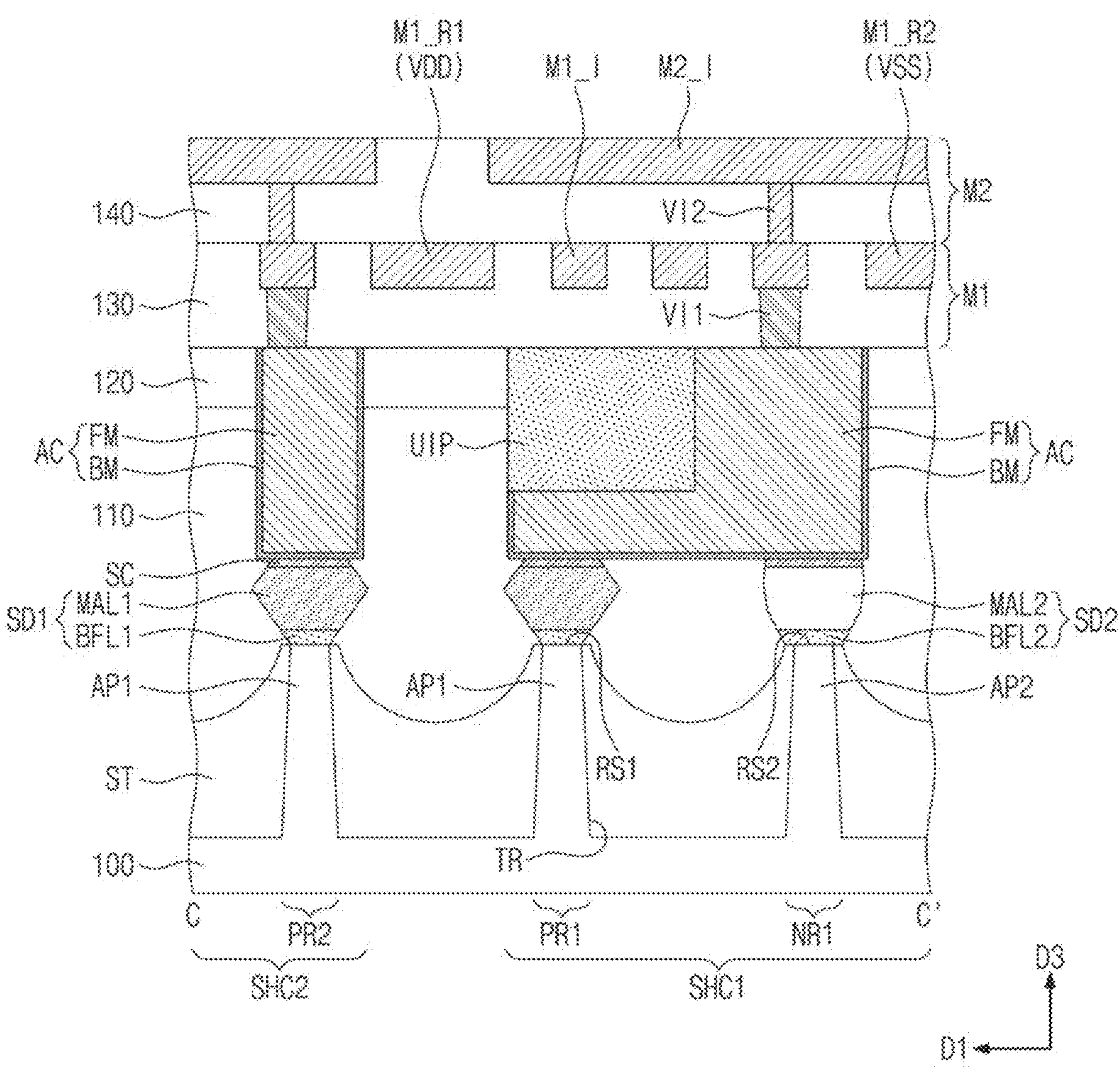
Figure 5D:
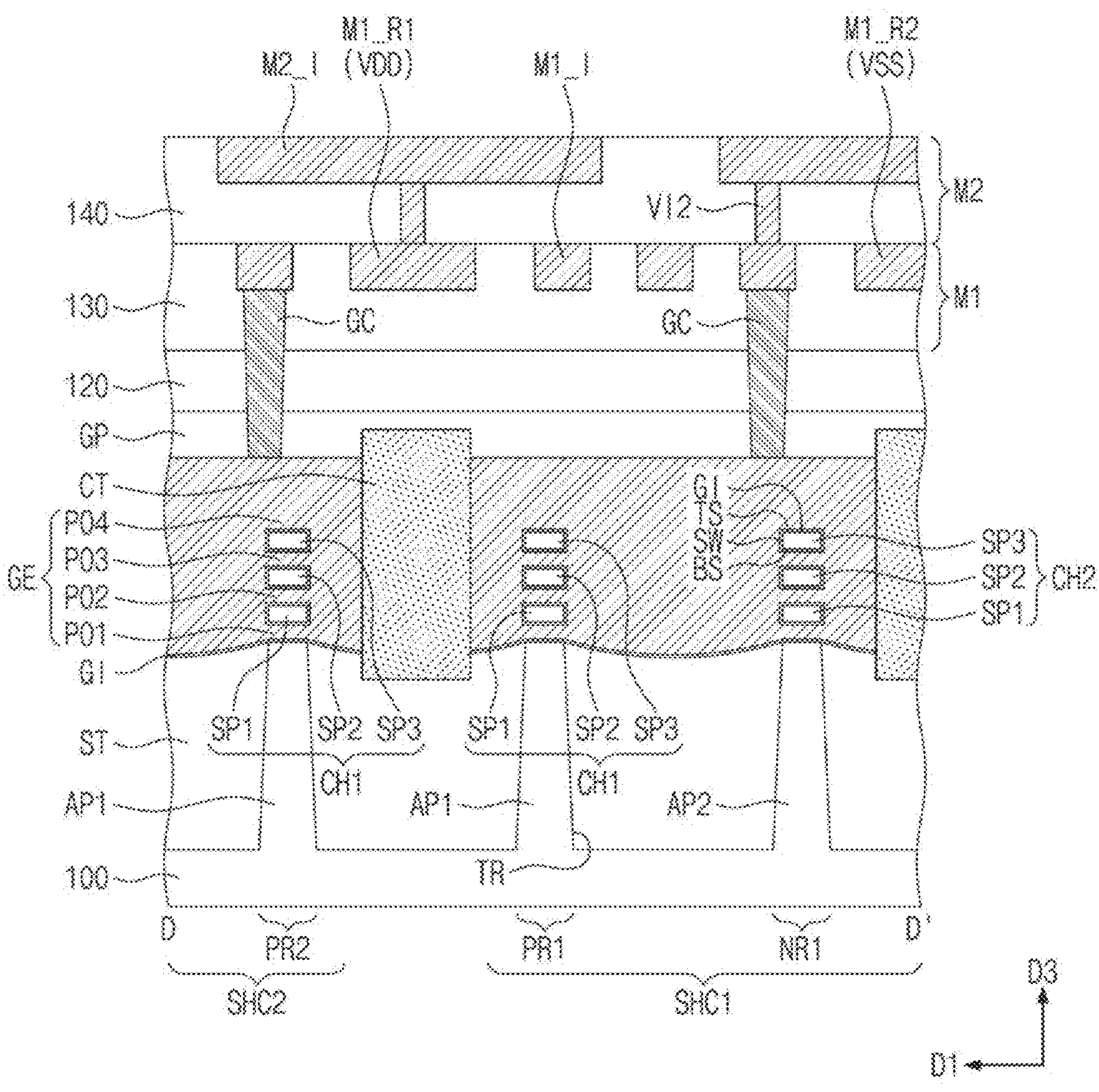

Referring back to FIGS. 5A and 5B, the first to third inner electrodes PO1, PO2, and PO3 may have different widths, and each of the first to third inner electrodes PO1, PO2 and PO3 may have varying widths (i.e., each inner electrode may have a first width corresponding to a first position and a second width corresponding to a second position as shown in FIGS. 5A-5D). For example, the largest width of the first inner electrode PO1 in the second direction D2 may be larger than the largest width of the second inner electrode PO2 in the second direction D2. The largest width of the first inner electrode PO1 may be larger than the largest width of the third inner electrode PO3 in the second direction D2.

Referring to FIG. 5D, the gate electrode GE may be provided on a top surface TS, a bottom surface BS, and opposite side surfaces SW of each of the first to third semiconductor patterns SP1, SP2, and SP3. That is, the transistor according to the present embodiment may be a three-dimensional field effect transistor (e.g., multi-bridge channel FET (MBCFET™) or gate-all-around FET (GAAFET)) in which the gate electrode GE is provided to three-dimensionally surround the channel pattern.

Referring to FIGS. 4 and 5A to 5D, the first single height cell SHC1 may have a first border BD1 and a second border BD2, which are opposite to each other in the second direction D2. The first and second borders BD1 and BD2 may extend in the first direction D1. The first single height cell SHC1 may have a third border BD3 and a fourth border BD4, which are opposite to each other in the first direction D1. The third and fourth borders BD3 and BD4 may extend in the second direction D2.

Gate cutting patterns CT may be disposed on a border, which is parallel to the second direction D2, of each of the first and second single height cells SHC1 and SHC2. For example, the gate cutting patterns CT may be disposed on the third and fourth borders BD3 and BD4 of the first single height cell SHC1. The gate cutting patterns CT may be arranged at the first pitch along the third border BD3. The gate cutting patterns CT may be arranged at the first pitch along the fourth border BD4. In a plan view, the gate cutting patterns CT on the third and fourth borders BD3 and BD4 may overlap or at least partially overlap respective gate electrodes GE. The gate cutting patterns CT may be formed of or include at least one of insulating materials (e.g., silicon oxide, silicon nitride, or combinations thereof).

A gate electrode on the first single height cell SHC1 may be separated from a gate electrode on the second single height cell SHC2 by the gate cutting pattern CT. The gate cutting pattern CT may be interposed between the gate electrodes GE on the first and second single height cells SHC1 and SHC2 which are aligned to each other in the first direction D1. That is, a gate electrode extending in the first direction D1 may be divided into a plurality of gate electrodes by the gate cutting patterns CT.

A pair of gate spacers GS may be respectively disposed on opposite side surfaces of the outer electrode PO4. The gate spacers GS may extend along a gate electrode GE and in the first direction D1. Top surfaces of the gate spacers GS may be higher than a top surface of a gate electrode GE. The top surfaces of the gate spacers GS may be coplanar with a top surface of a first interlayer insulating layer 110, which will be described below. In an embodiment, the gate spacers GS may be formed of or include at least one of SiCN, SiCON, or SiN. In another embodiment, the gate spacers GS may be a multi-layered structure, which is formed of or includes at least two different materials selected from SiCN, SiCON, and SiN.

A gate capping pattern GP may be provided on a gate electrode GE. The gate capping pattern GP may extend along a gate electrode or in the first direction D1. The gate capping pattern GP may be formed of or include a material having an etch selectivity with respect to first and second interlayer insulating layers 110 and 120, which will be described below. The gate capping pattern GP may be formed of or include at least one of SiON, SiCN, SiCON, or SiN.

A gate insulating layer GI may be interposed between a gate electrode and the first channel pattern CH1 and between a gate electrode and the second channel pattern CH2. The gate insulating layer GI may cover or at least partially cover the top surface TS, the bottom surface BS, and the opposite side surfaces SW of each of the first to third semiconductor patterns SP1, SP2, and SP3. The gate insulating layer GI may cover or at least partially cover a top surface of the device isolation layer ST below the gate electrode GE.

In an embodiment, the gate insulating layer GI may include a silicon oxide layer, a silicon oxynitride layer, and/or a high-k dielectric layer. The high-k dielectric layer may be formed of or include at least one of high-k dielectric materials whose dielectric constants are higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In another embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and lead zirconium titanium oxide. The hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and yttrium (Y).

In the case where the dopants are aluminum (Al), a content of aluminum in the ferroelectric layer may range from 3 at % (atomic percentage) to 8 at %. The content of the dopants (e.g., aluminum atoms) may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to about 80 at %.

The paraelectric layer may have the paraelectric property. The paraelectric layer may be formed of or include at least one of, for example, silicon oxide and high-k metal oxides. The metal oxides, which may be used as the paraelectric layer, may include at least one of, for example, hafnium oxide, zirconium oxide, and/or aluminum oxide, but the disclosure is not limited to these examples.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property when its thickness is in a specific range. In an embodiment, the ferroelectric layer may have a thickness ranging from about 0.5 nm to about 10 nm, but the disclosure is not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

Referring back to FIGS. 4 and 5A to 5D, a gate electrode may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work-function metal, which can be used to adjust a threshold voltage of the transistor. By adjusting a thickness and composition of the first metal pattern, it may be possible to realize a transistor having a desired threshold voltage. For example, the first to third inner electrodes PO1, PO2, and PO3 of the gate electrode may be composed of the first metal pattern or the work-function metal.

The first metal pattern may include a metal nitride layer. For example, the first metal pattern may include a layer that is composed of at least one metallic material of titanium (Ti), tantalum (Ta), aluminum (Al), tungsten (W) and molybdenum (Mo), and nitrogen (N). In an embodiment, the first metal pattern may further include carbon (C). The first metal pattern may include a plurality of stacked work-function metal layers.

The second metal pattern may be formed of or include a metallic material with a resistance lower than the first metal pattern. For example, the second metal pattern may include at least one metallic material of tungsten (W), aluminum (Al), titanium (Ti), and tantalum (Ta). The outer electrode PO4 may include the first metal pattern and the second metal pattern on the first metal pattern.

A first interlayer insulating layer 110 may be provided on the substrate 100. The first interlayer insulating layer 110 may cover or at least partially cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to cover or at least partially cover the gate capping pattern GP. A third interlayer insulating layer 130 may be provided on the second interlayer insulating layer 120. A fourth interlayer insulating layer 140 may be provided on the third interlayer insulating layer 130. In an embodiment, at least one of the first to fourth interlayer insulating layers 110 to 140 may include a silicon oxide layer.

A pair of division structures DB may be provided at both sides of each of the first and second single height cells SHC1 and SHC2 to be opposite to each other in the second direction D2. For example, a pair of the division structures DB may be respectively provided on the first and second borders BD1 and BD2 of the first single height cell SHC1. The division structure DB may extend in the first direction D1 to be parallel to the gate electrodes GE. A pitch between the division structure DB and the gate electrode GE adjacent thereto may be equal to the first pitch.

The division structure DB may be provided to penetrate the gate capping pattern GP and a gate electrode and may extend into the first and second active patterns AP1 and AP2. The division structure DB may be provided to penetrate an upper portion of each of the first and second active patterns AP1 and AP2. The division structure DB may electrically separate an active region of each of the first and second single height cells SHC1 and SHC2 from an active region of a neighboring cell.

Active contacts AC may be provided to penetrate the first and second interlayer insulating layers 110 and 120 and to be electrically connected to the first and second source/drain patterns SD1 and SD2, respectively. A pair of the active contacts AC may be respectively provided at both sides of a gate electrode. In a plan view, the active contact AC may be a bar-shaped pattern that extends in the first direction D1.

The active contact AC may be a self-aligned contact. For example, the active contact AC may be formed by a self-alignment process using the gate capping pattern GP and the gate spacer GS. For example, the active contact AC may cover or at least partially cover at least a portion of the side surface of the gate spacer GS. The active contact AC may cover or at least partially cover a portion of the top surface of the gate capping pattern GP.

A metal-semiconductor compound layer SC (e.g., a silicide layer) may be respectively interposed between the active contact AC and the first source/drain pattern SD1 and between the active contact AC and the second source/drain pattern SD2. The active contact AC may be electrically connected to the source/drain pattern SD1 or SD2 through the metal-semiconductor compound layer SC. For example, the metal-semiconductor compound layer SC may be formed of or include at least one of titanium silicide, tantalum silicide, tungsten silicide, nickel silicide, and cobalt silicide.

Referring to FIG. 5C, at least one of the active contacts AC on the first single height cell SHC1 may electrically connect the first source/drain pattern SD1 of the first PMOSFET region PR1 to the second source/drain pattern SD2 of the first NMOSFET region NR1. The active contact AC may extend from the second source/drain pattern SD2 of the first NMOSFET region NR1 to the first source/drain pattern SD1 of the first PMOSFET region PR1 in the first direction D1.

The active contact AC may include a barrier metal BM and a filler metal FM on the barrier metal BM. The barrier metal BM may be provided to enclose all surfaces of the filler metal FM except for a top surface. For example, the filler metal FM may be formed of or include at least one of molybdenum, tungsten, ruthenium, cobalt, and vanadium. In an embodiment, the filler metal FM may be formed of or include molybdenum. The barrier metal BM may include a metal nitride layer. The metal nitride layer may be formed of or include at least one of titanium nitride (TiN), tantalum nitride (TaN), tungsten nitride (WN), nickel nitride (NiN), cobalt nitride (CoN), and platinum nitride (PtN).

Gate contacts GC may be provided to penetrate the third interlayer insulating layer 130, the second interlayer insulating layer 120, and the gate capping pattern GP and to be electrically connected to the gate electrodes, respectively. In a plan view, two gate contacts GC on the first single height cell SHC1 may be disposed to be overlapped with the first PMOSFET region PR1. That is, the two gate contacts GC on the first single height cell SHC1 may be provided on the first active pattern AP1 (e.g., see FIG. 5A). In a plan view, one gate contact GC on the first single height cell SHC1 may be disposed to be overlapped with the first NMOSFET region NR1. That is, the one gate contact GC on the first single height cell SHC1 may be provided on the second active pattern AP2 (e.g., see FIG. 5B).

The gate contact GC may be freely disposed on a gate electrode, without any limitation in its position. For example, the gate contacts GC on the second single height cell SHC2 may be respectively disposed on the second PMOSFET region PR2, the second NMOSFET region NR2, and the device isolation layer ST filling the trench TR (e.g., see FIG. 4).

In an embodiment, referring to FIGS. 5A and 5B, an upper portion of the active contact AC adjacent to the gate contact GC may be filled with an upper insulating pattern UIP. A bottom surface of the upper insulating pattern UIP may be lower than a bottom surface of the gate contact GC. In other words, a top surface of the active contact AC adjacent to the gate contact GC may be formed at a level, which is lower than the bottom surface of the gate contact GC, by the upper insulating pattern UIP. Accordingly, the gate contact GC and the active contact AC, which are adjacent to each other, may be prevented from contacting each other and thereby a short circuit issue may be prevented from occurring therebetween.

A first via VI1 may be provided on the active contact AC. A top surface of the first via VI1 may be located at the same level as a top surface of the gate contact GC (e.g., see FIG. 5B). In an embodiment, the first via VI1 and the gate contact GC may be formed at the same time using the same process. The first via VI1 and the gate contact GC may be formed of or include the same material. The first via VI1 and the gate contact GC may be formed of or include at least one of molybdenum, tungsten, ruthenium, cobalt, and vanadium.

A first metal layer M1 may be provided in the third interlayer insulating layer 130. For example, the first metal layer M1 may include the first power line M1_R1, the second power line M1_R2, the third power line M1_R3, and first interconnection lines M1_I. The interconnection lines M1_R1, M1_R2, M1_R3, and M1_I of the first metal layer M1 may extend in the second direction D2 to be parallel to each other.

The first and second power lines M1_R1 and M1_R2 may be provided on the third and fourth borders BD3 and BD4 of the first single height cell SHC1, respectively. The first power line M1_R1 may extend along the third border BD3 and in the second direction D2. The second power line M1_R2 may extend along the fourth border BD4 and in the second direction D2.

The first interconnection lines M1_I of the first metal layer M1 may be arranged at a second pitch in the first direction D1. The second pitch may be smaller than the first pitch. A linewidth of each of the first interconnection lines M1_I may be smaller than a linewidth of each of the first to third power lines M1_R1, M1_R2, and M1_R3.

The active contact AC and the interconnection line of the first metal layer M1 may be electrically connected to each other through the first via VI1. The gate electrode and the interconnection line of the first metal layer M1 may be electrically connected to each other through the gate contact GC.

The interconnection line of the first metal layer M1 and the first via VI1 thereunder may be formed by separate processes. For example, the interconnection line and the first via VI1 of the first metal layer M1 may be independently formed by respective single damascene processes. The semiconductor device according to the disclosure may be fabricated using a sub-20 nm process.

A second metal layer M2 may be provided in the fourth interlayer insulating layer 140. The second metal layer M2 may include a plurality of second interconnection lines M2_I. Each of the second interconnection lines M2_I of the second metal layer M2 may be a line- or bar-shaped pattern that is extended in the first direction D1. In other words, the second interconnection lines M2_I may extend in the first direction D1 and parallel to each other.

The second metal layer M2 may further include second vias VI2, which are respectively provided below the second interconnection lines M2_I. The interconnection lines of the first and second metal layers M1 and M2 may be electrically connected to each other through the second via VI2. The interconnection line of the second metal layer M2 and the second via VI2 thereunder may be formed together by a dual damascene process.

The interconnection lines of the first metal layer M1 may be formed of or include a conductive material that is the same as or different from those of the second metal layer M2. For example, the interconnection lines of the first and second metal layers M1 and M2 may be formed of or include at least one of metallic materials of copper, ruthenium, aluminum, tungsten, molybdenum, and cobalt. A plurality of metal layers (e.g., M3, M4, M5, etc.) may be additionally stacked on the fourth interlayer insulating layer 140. Each of the stacked metal layers may include interconnection lines, which are used as routing paths between cells.

The first source/drain pattern SD1 will be described in more detail with reference to FIG. 6A. The first source/drain pattern SD1 may include a first buffer layer BFL1 and a first main layer MAL1 on the first buffer layer BFL1.

The first buffer layer BFL1 may cover or at least partially cover an inner surface of the first recess RS1. In an embodiment, the first buffer layer BFL1 may have a decreasing thickness in an upward direction. For example, a thickness of the first buffer layer BFL1 may be larger when measured in the third direction D3 at a bottom level of the first recess RS1 than when measured in the second direction D2 at an upper level of the first recess RS1. The first buffer layer BFL1 may have a 'U'-shaped section corresponding to the profile of the first recess RS1.

In an embodiment, the first buffer layer BFL1 may have an uneven or embossing side surface. In other words, the side surface of the first buffer layer BFL1 may have a wavy profile. The side surface of the first buffer layer BFL1 may be protruded toward the first to third inner electrodes PO1, PO2, and PO3.

The first main layer MAL1 may fill most of the remaining space of the first recess RS1, except for the first buffer layer BFL1. A volume of the first main layer MAL1 may be larger than a volume of the first buffer layer BFL1. In other words, a ratio of the volume of the first main layer MAL1 to a total volume of the first source/drain pattern SD1 may be greater than a ratio of the volume of the first buffer layer BFL1 to the total volume of the first source/drain pattern SD1.

The first buffer layer BFL1 and the first main layer MAL1 may be formed of or include silicon-germanium (SiGe). The first buffer layer BFL1 may contain a relatively low concentration in germanium (Ge). Alternatively, the first buffer layer BFL1 may contain only silicon (Si) without germanium (Ge). A germanium concentration in the first buffer layer BFL1 may range from 0 at % to 30 at %. In particular, the germanium concentration in the first buffer layer BFL1 may range from 2 at % to 30 at %. In more particular, the germanium concentration in the first buffer layer BFL1 may range from 2 at % to 10 at %.

The first main layer MAL1 may contain a relatively high concentration of germanium (Ge). As an example, a germanium concentration in the first main layer MAL1 may range from 30 at % to 70 at %. The germanium concentration in the first main layer MAL1 may increase in the third direction D3. For example, the first main layer MAL1, which is adjacent to the first buffer layer BFL1, may have a germanium concentration of about 40 at %, but an upper portion of the first main layer MAL1 may have a germanium concentration of about 60 at %.

Figure 6A:
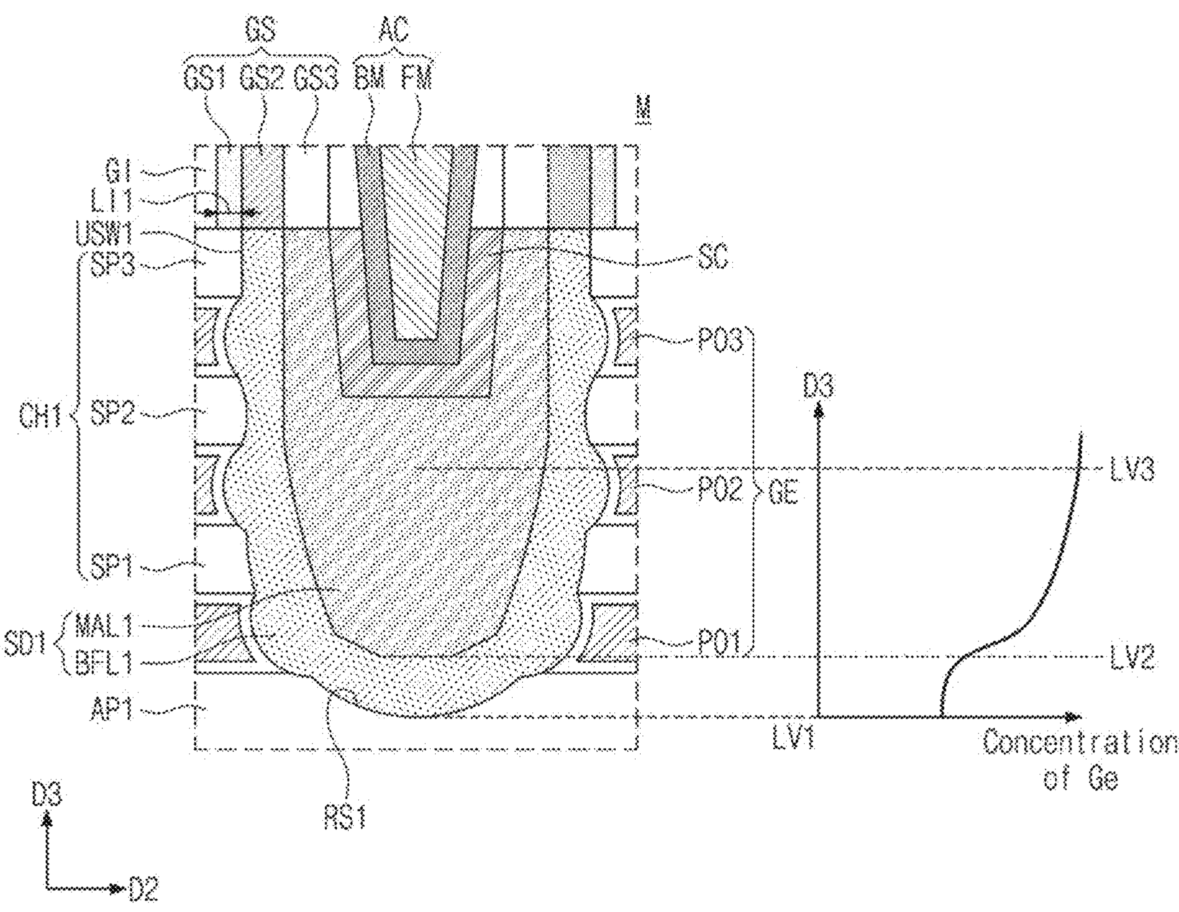
FIG. 6A is an enlarged cross-sectional view illustrating a portion 'M' of FIG. 5A according to an embodiment of the disclosure.

FIG. 6A is an enlarged cross-sectional view illustrating a portion 'M' of FIG. 5A according to an embodiment of the disclosure. More specifically, referring to FIG. 6A, the germanium concentration profile measured in the third direction D3 shows that the germanium concentration is maintained to a relatively low value within a range from a first level LV1 to a second level LV2. The germanium concentration may gradually increase in a direction from the second level LV2 toward a third level LV3.

Each of the first buffer layer BFL1 and the first main layer MAL1 may contain impurities (e.g., boron, gallium, or indium) that enable the first source/drain pattern SD1 to have a p-type. The impurity concentration in each of the first buffer layer BFL1 and the first main layer MAL1 may range from 1×10ˆ18 atom/cm$^3$ to 5×10ˆ22 atom/cm$^3$. The impurity concentration in the first main layer MAL1 may be higher than the impurity concentration in the first buffer layer BFL1.

The first buffer layer BFL1 may prevent a stacking fault from occurring between the substrate 100 (i.e., the first active pattern AP1) and the first main layer MAL1 and between the first to third semiconductor patterns SP1, SP2, and SP3 and the first main layer MAL1. The stacking fault may lead to an increase of a channel resistance. The stacking fault may easily occur on the bottom of the first recess RS1. By contrast, according to an embodiment of the disclosure, the first buffer layer BFL1 may be formed to have a relatively large thickness at a region adjacent to the bottom of the first recess RS1, and in this case, the stacking fault may be prevented.

The first buffer layer BFL1 may protect the first main layer MAL1 in a process of replacing sacrificial layers SAL, which will be described below, with the first to third inner electrodes PO1, PO2, and PO3 of the gate electrode GE. That is, the first buffer layer BFL1 may prevent an etching material, which is used to remove the sacrificial layers SAL, from entering and etching the first main layer MAL1.

Figure 6B:
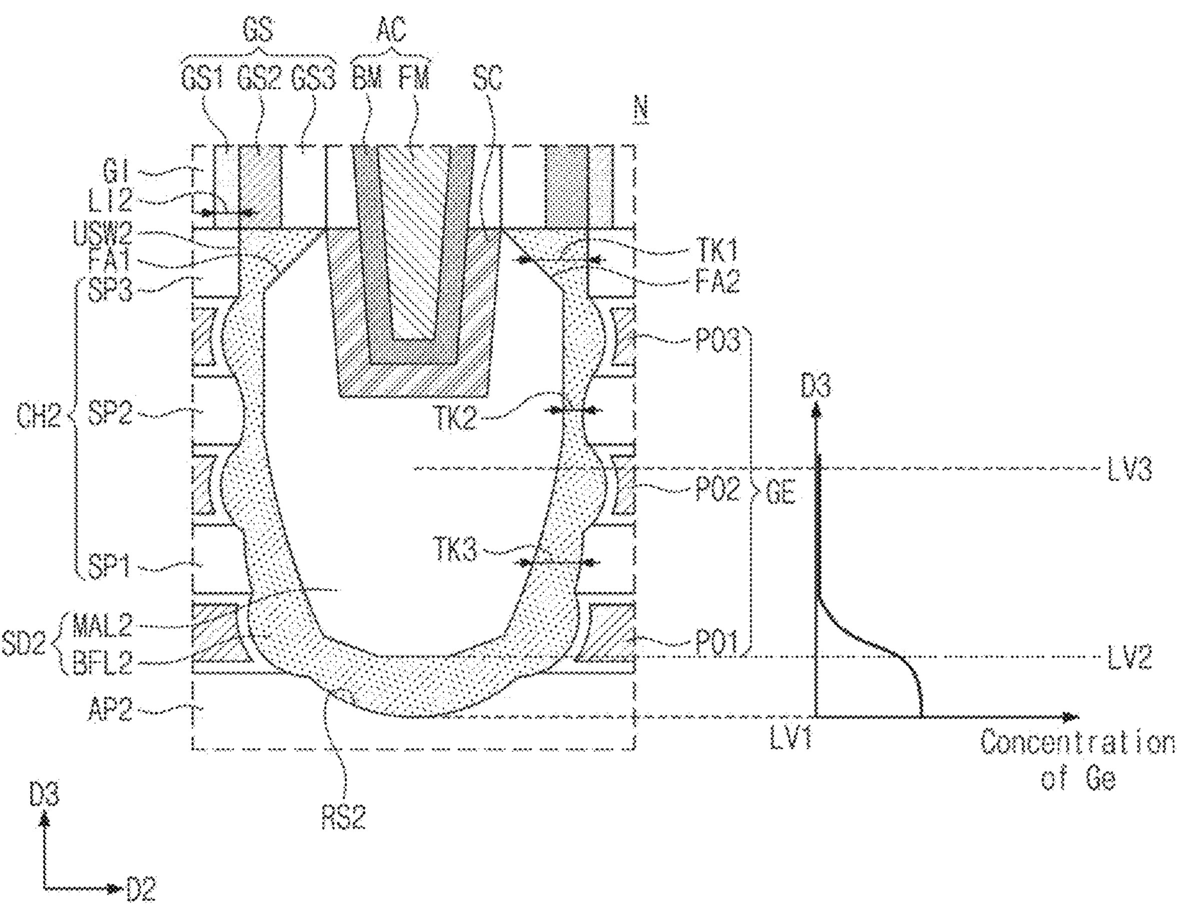
FIG. 6B is an enlarged cross-sectional view illustrating a portion 'N' of FIG. 5B according to an embodiment of the disclosure.

FIG. 6B is an enlarged cross-sectional view illustrating a portion 'N' of FIG. 5B according to an embodiment of the disclosure. The second source/drain pattern SD2 may include a second buffer layer BFL2 and a second main layer MAL2 on the second buffer layer BFL2. The second buffer layer BFL2 may cover or at least partially cover an inner side surface of the second recess RS2. The shape and material of the second buffer layer BFL2 may be similar to or the same as the first buffer layer BFL1 described above. The second buffer layer BFL2 may have an uneven side surface, like the first buffer layer BFL1. The second buffer layer BFL2 may be formed of or include silicon-germanium (SiGe) and may include a germanium concentration ranging from 2 at % to 30 at %. However, the second buffer layer BFL2 may include an impurity (e.g., phosphorus) different from the first buffer layer BFL1.

The second main layer MAL2 may contain silicon (Si). In an embodiment, a silicon concentration in the second main layer MAL2 may range from 90 at % to 100 at %. More specifically, referring to FIG. 6B, the germanium concentration profile measured in the third direction D3 shows that the germanium concentration is maintained to a relative low value in a range from the first level LV1 to the second level LV2. The germanium concentration may gradually decrease in a direction from the second level LV2 toward the third level LV3 and may converge to a value of 0 at %.

Each of the second buffer layer BFL2 and the second main layer MAL2 may contain an impurity (e.g., phosphorus) that enables the second source/drain pattern SD2 to have an n-type conductivity. The impurity concentration in each of the second buffer layer BFL2 and the second main layer MAL2 may range from 1×10ˆ18 atom/cm$^3$ to 5×10ˆ22 atom/cm$^3$. The impurity concentration in the second main layer MAL2 may be higher than the impurity concentration in the second buffer layer BFL2. The impurity concentration in the second main layer MAL2 may increase in an upward direction.

The second main layer MAL2 of the second source/drain pattern SD2 may include an upper portion having a first facet surface FA1 and a second facet surface FA2. The first and second facet surfaces FA1 and FA2 may be provided below a pair of the gate spacers GS, respectively. Each of the first and second facet surfaces FA1 and FA2 may be a {111} plane. The second buffer layer BFL2 may directly cover or at least partially cover the first and second facet surfaces FA1 and FA2.

Due to the first and second facet surfaces FA1 and FA2, a width of the second main layer MAL2, which is measured in the second direction D2, may increase from its top surface toward its center region (e.g., LV3). The second buffer layer BFL2 may have a first thickness TK1 between the third semiconductor pattern SP3 and the second main layer MAL2. The second buffer layer BFL2 may have a second thickness TK2 between the second semiconductor pattern SP2 and the second main layer MAL2. The second buffer layer BFL2 may have a third thickness TK3 between the first semiconductor pattern SP1 and the second main layer MAL2. The first to third thicknesses TK1 to TK3 may be different from each other. For example, the third thickness TK3 may be larger than the second thickness TK2. The first thickness TK1 may be larger than the third thickness TK3.

Referring to FIG. 6A, the gate spacer GS may be provided on the gate insulating layer GI. The gate spacer GS may include a first spacer GS1, a second spacer GS2, and a third spacer GS3. Each of the first to third spacers GS1 to GS3 may be formed of or include at least one of Si-containing insulating materials.

The first spacer GS1 may be formed of or include silicon nitride (SiN) or carbon-containing silicon nitride (SiCN). The first spacer GS1 may have a thickness ranging from about 1 nm to about 3 nm. The first spacer GS1 may directly contact and cover or at least partially cover the gate insulating layer GI. The first spacer GS1 may directly contact the side surface of the first buffer layer BFL1 (e.g., see FIG. 7).

The second spacer GS2 may be formed of or include at least one of Si-containing low-k dielectric materials (e.g., SiCON). The second spacer GS2 may be thicker than the first spacer GS1. The second spacer GS2 may have a thickness ranging from about 5 nm to about 12 nm. A dielectric constant of the second spacer GS2 may be lower than a dielectric constant of the first spacer GS1. The second spacer GS2 may also directly contact the side surface of the first buffer layer BFL1 (e.g., see FIG. 7).

The third spacer GS3 may be formed of or include silicon oxide (SiO), silicon oxynitride (SiON), or silicon nitride (SiN). The third spacer GS3 may be thicker than the second spacer GS2. The third spacer GS3 may cover or at least partially cover the side surface of the first buffer layer BFL1 (e.g., see FIG. 7).

The first buffer layer BFL1 of the first source/drain pattern SD1 may have a first upper side surface USW1. The first upper side surface USW1 of the first buffer layer BFL1 may directly contact the third semiconductor pattern SP3. The first upper side surface USW1 of the first buffer layer BFL1 may be substantially parallel to the third direction D3. The first upper side surface USW1 of the first buffer layer BFL1 may be vertically aligned to an outer side surface of the first spacer GS1. A horizontal distance between the first upper side surface USW1 of the first buffer layer BFL1 and the gate insulating layer GI may be a first distance LI1. The first distance LI1 may be substantially equal to a thickness of the first spacer GS1.

Referring to FIG. 6B, the second buffer layer BFL2 of the second source/drain pattern SD2 may have a second upper side surface USW2. The second upper side surface USW2 of the second buffer layer BFL2 may directly contact the third semiconductor pattern SP3. The second upper side surface USW2 of the second buffer layer BFL2 may be substantially parallel to the third direction D3. The second upper side surface USW2 of the second buffer layer BFL2 may be vertically aligned to the outer side surface of the first spacer GS1. A horizontal distance between the second upper side surface USW2 of the second buffer layer BFL2 and the gate insulating layer GI may be a second distance LI2. The second distance LI2 may be substantially equal to the thickness of the first spacer GS1.

According to an embodiment of the disclosure, the second distance LI2 may be substantially equal to the first distance LI1. In an embodiment, the proximity between the first source/drain pattern SD1 and the gate electrode GE may be substantially the same as the proximity between the second source/drain pattern SD2 and the gate electrode GE. Thus, it may be possible to improve the performance of the semiconductor device (in particular, the performance of the NMOSFET).

Figure 7:
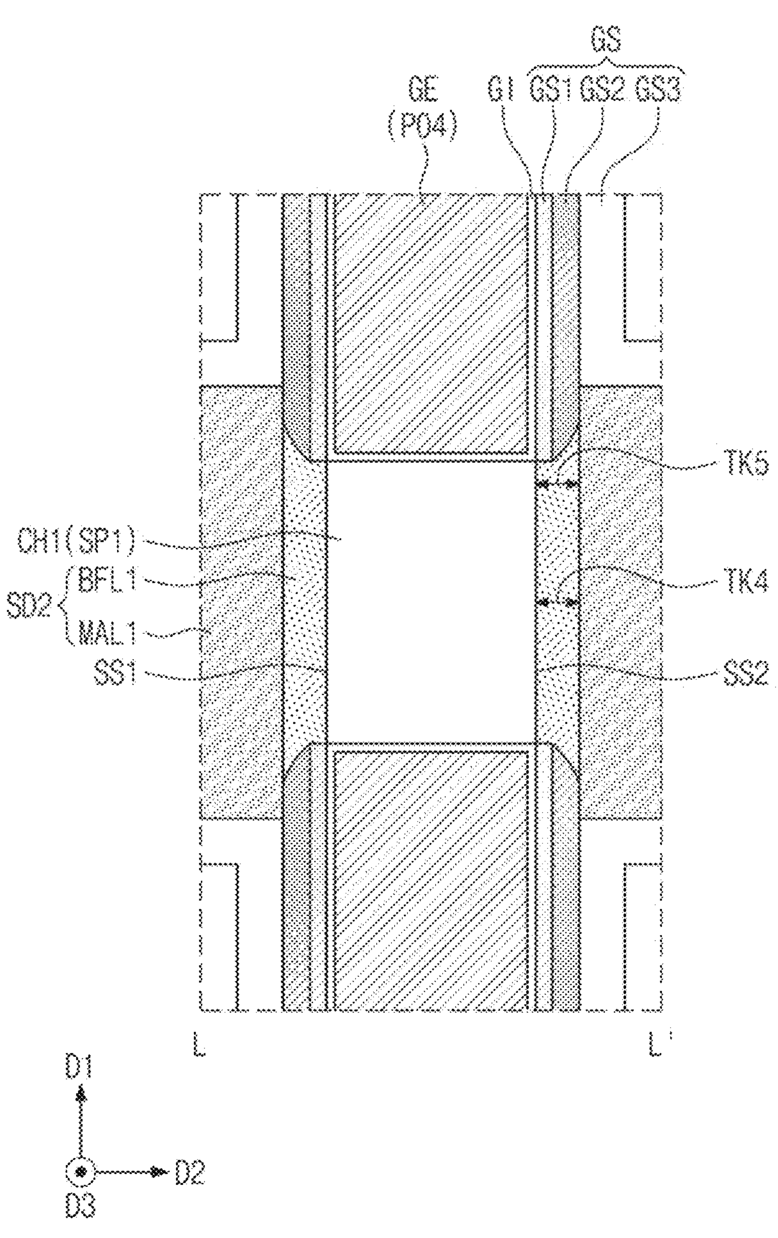
FIG. 7 is a plan view corresponding to a line L-L' of FIG. 5A according to an embodiment of the disclosure.

FIG. 7 is a plan view corresponding to a line L-L' of FIG. 5A according to an embodiment of the disclosure. That is, FIG. 7 is a plan view of a semiconductor device, which is obtained by planarizing the semiconductor device to a level of the first semiconductor pattern SP1 of the first channel pattern CH1 (e.g., the line L-L'). Referring to FIG. 7, the first semiconductor pattern SP1 of the first channel pattern CH1 may include first and second side surfaces SS1 and SS2, which are opposite to each other.

The first buffer layer BFL1 may be provided on each of the first and second side surfaces SS1 and SS2. The first buffer layer BFL1 may directly contact each of the first and second side surfaces SS1 and SS2. The first buffer layer BFL1 may be interposed between the gate spacers GS, which are adjacent to each other in the first direction D1. The first buffer layer BFL1 may be interposed between the first spacers GS1, which are adjacent to each other in the first direction D1. In addition, the first buffer layer BFL1 may be interposed between the second spacers GS2, which are adjacent to each other in the first direction D1.

A center portion of the first buffer layer BFL1 may have a fourth thickness TK4. A side portion of the first buffer layer BFL1 may have a fifth thickness TK5. The side portion of the first buffer layer BFL1 may be a region that contacts or is adjacent to the first and second spacers GS1 and GS2. In an embodiment, the fifth thickness TK5 may be substantially equal to the fourth thickness TK4. A ratio of the fifth thickness TK5 to the fourth thickness TK4 (i.e., TK5/TK4) may range from about 0.7 to about 1.

According to an embodiment of the disclosure, the first buffer layer BFL1 may be provided to have a uniform thickness (e.g., TK4 or TK5) on the first and second side surfaces SS1 and SS2. That is, the side portion of the first buffer layer BFL1 may be thick enough to allow the fifth thickness TK5 to be equal or similar to the fourth thickness TK4.

If the fifth thickness TK5 of the first buffer layer BFL1 is small or the ratio of TK5/TK4 is smaller than about 0.7, an etching material in a wet etching process of forming the gate electrode GE may be easily supplied to the first main layer MAL1 through the side portion of the first buffer layer BFL1. In this case, the first main layer MAL1 may be removed, causing a process failure, such as undesired damage of the first source/drain pattern SD1.

The side portion of the first buffer layer BFL1 may be formed to have a sufficiently-large thickness (e.g., TK5). Accordingly, the first buffer layer BFL1 may effectively protect the first main layer MAL1 in the wet etching process. As a result, according to an embodiment of the disclosure, the first buffer layer BFL1 may improve the reliability of the semiconductor device.

FIGS. 8A, 8B, 9A, 9B, 10A, 10B, 10C, 11A, 11B, 11C, 12A, 12B, 12C, 13A, 13B, 13C, 14A, 14B, 14C, 15A, 15B, 15C, 16A, 16B and 16C are cross-sectional views illustrating a method of fabricating a semiconductor device, according to an embodiment of the disclosure. That is, FIGS. 8A, 9A, 10A, 11A, 12A, 13A, 14A, 15A, and 16A are cross-sectional views corresponding to the line A-A' of FIG. 4. FIGS. 10B, 11B, 12B, 13B, 14B, 15B, and 16B are cross-sectional views corresponding to the line B-B' of FIG. 4. FIGS. 10C, 11C, 12C, 13C, and 14C are cross-sectional views corresponding to the line C-C' of FIG. 4. FIGS. 8B, 9B, 15C, and 16C are cross-sectional views corresponding to the line D-D' of FIG. 4.

Figure 8A:
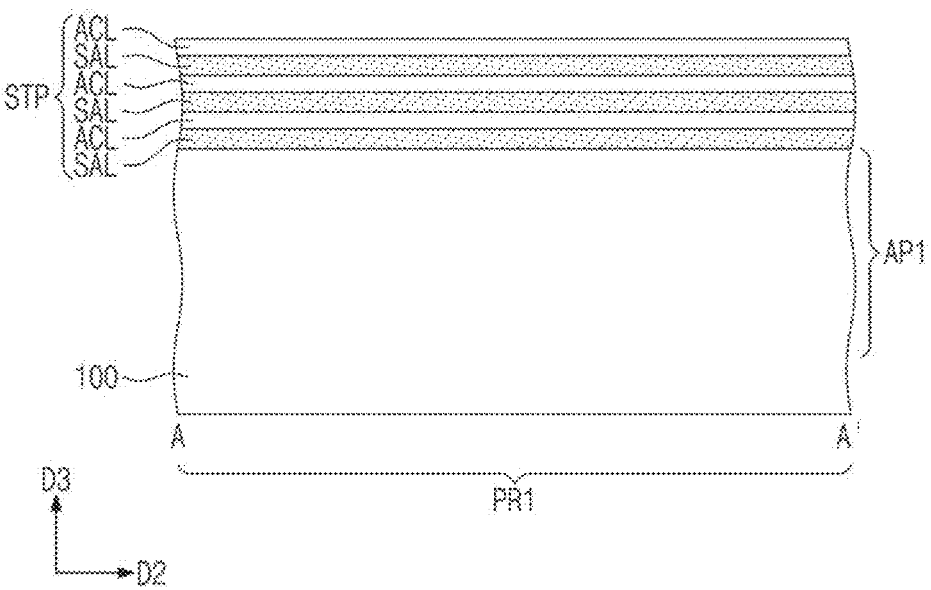
FIGS. 8A, 8B, 9A, 9B, 10A, 10B, 10C, 11A, 11B, 11C, 12A, 12B, 12C, 13A, 13B, 13C, 14A, 14B, 14C, 15A, 15B, 15C, 16A, 16B and 16C are cross-sectional views illustrating a method of fabricating a semiconductor device, according to an embodiment of the disclosure.
Figure 8B:
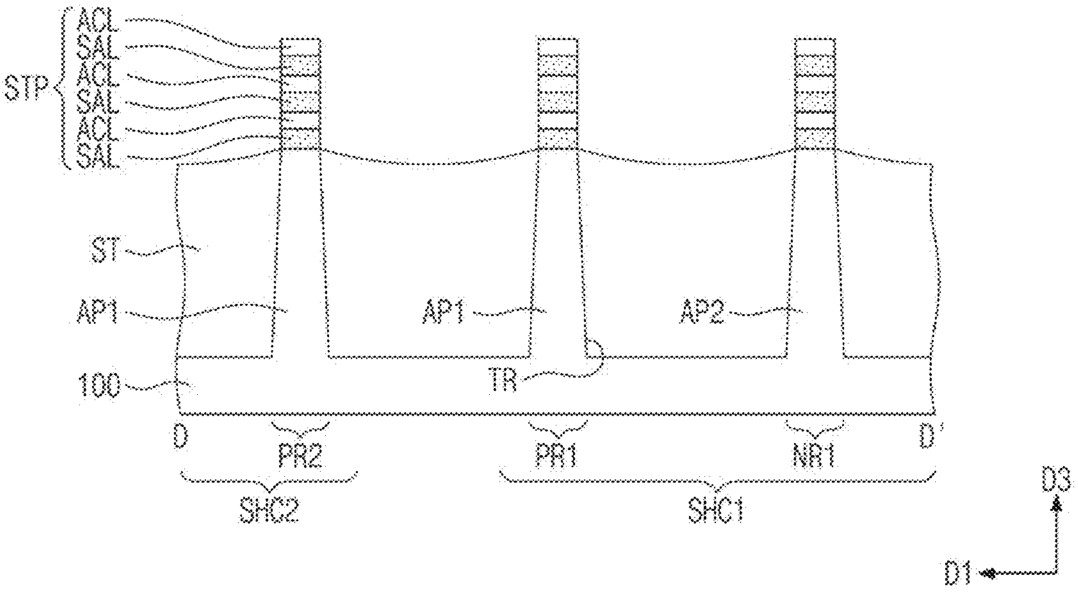

Referring to FIGS. 8A and 8B, the substrate 100 including the first and second PMOSFET regions PR1 and PR2 and the first and second NMOSFET regions NR1 and NR2 may be provided. Active and sacrificial layers ACL and SAL may be alternately stacked on the substrate 100. The active and sacrificial layers ACL and SAL may be formed of or include at least one of silicon (Si), germanium (Ge), or silicon-germanium (SiGe), and the active and sacrificial layers ACL and SAL may be formed of different materials from each other.

The sacrificial layer SAL may be formed of at least one of materials having an etch selectivity with respect to the active layer ACL. For example, the active layers ACL may be formed of or include silicon (Si), and the sacrificial layers SAL may be formed of or include silicon germanium (SiGe). A germanium concentration in each of the sacrificial layers SAL may range from 10 at % to 30 at %.

Mask patterns may be respectively formed on the first and second PMOSFET regions PR1 and PR2 and the first and second NMOSFET regions NR1 and NR2 of the substrate 100. The mask pattern may be a line-shaped or bar-shaped pattern that extends in the second direction D2.

A patterning process using the mask patterns as an etch mask may be performed to form the trench TR defining the first and second active patterns AP1 and AP2. The first active pattern AP1 may be formed on each of the first and second PMOSFET regions PR1 and PR2. The second active pattern AP2 may be formed on each of the first and second NMOSFET regions NR1 and NR2.

A stacking pattern STP may be formed on each of the first and second active patterns AP1 and AP2. The stacking pattern STP may include the active layers ACL and the sacrificial layers SAL which are alternately stacked on top of each other. The stacking pattern STP may be formed together with the first and second active patterns AP1 and AP2, during the patterning process.

The device isolation layer ST may be formed to fill the trench TR. An insulating layer may be formed on the substrate 100 to cover or at least partially cover the first and second active patterns AP1 and AP2 and the stacking patterns STP. The device isolation layer ST may be formed by recessing the insulating layer to expose the stacking patterns STP.

The device isolation layer ST may be formed of or include at least one insulating material (e.g., silicon oxide). The stacking patterns STP may be placed above the device isolation layer ST and may be exposed to the outside of the device isolation layer ST. In other words, the stacking patterns STP may protrude vertically above the device isolation layer ST.

Figure 9A:
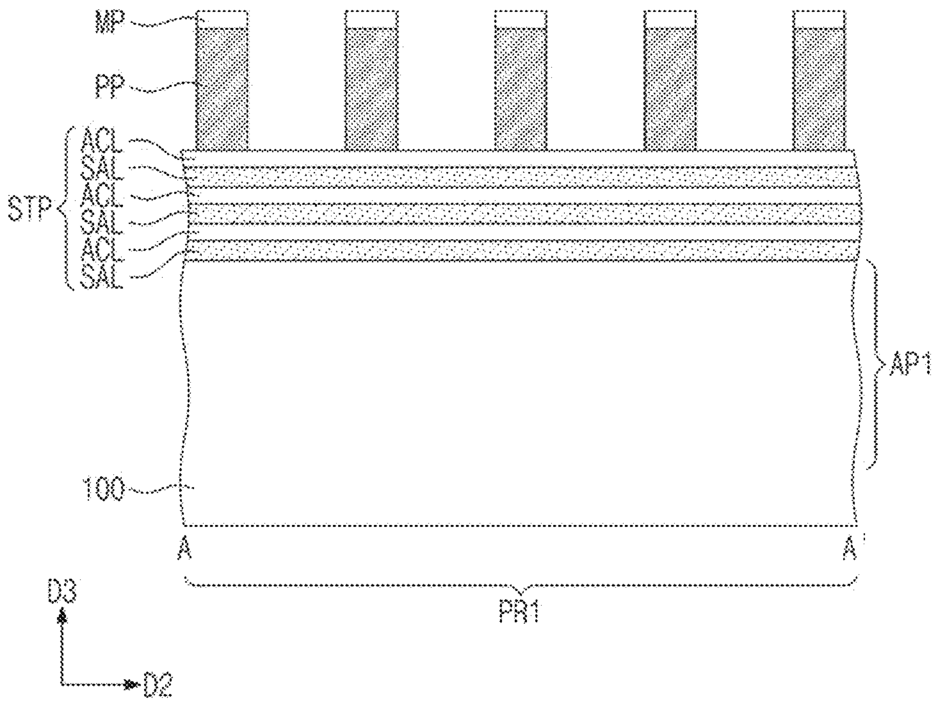
Figure 9B:
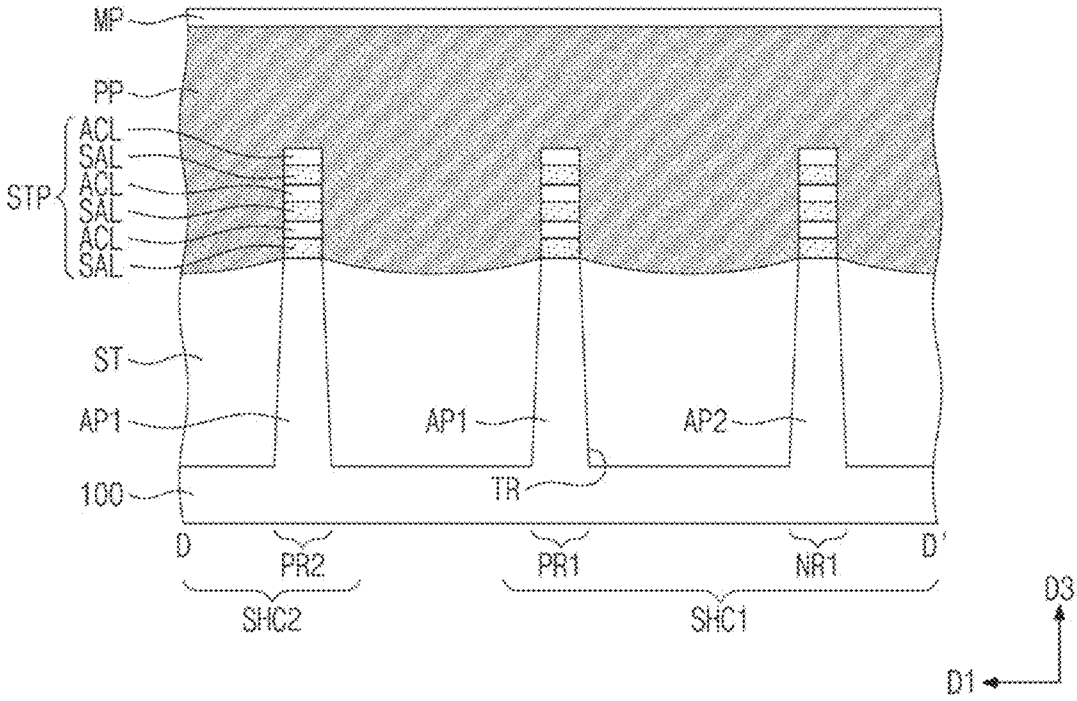

Referring to FIGS. 9A and 9B, sacrificial patterns PP may be formed on the substrate 100 to cross the stacking patterns STP. Each of the sacrificial patterns PP may be a line-shaped or bar-shaped pattern that extends in the first direction D1. The sacrificial patterns PP may be arranged at a first pitch in the second direction D2.

The formation of the sacrificial patterns PP may include forming a sacrificial layer on the substrate 100, forming hard mask patterns MP on the sacrificial layer, and patterning the sacrificial layer using the hard mask patterns MP as an etch mask. In an embodiment, the sacrificial layer may be formed of or include polysilicon.

Figure 10A:
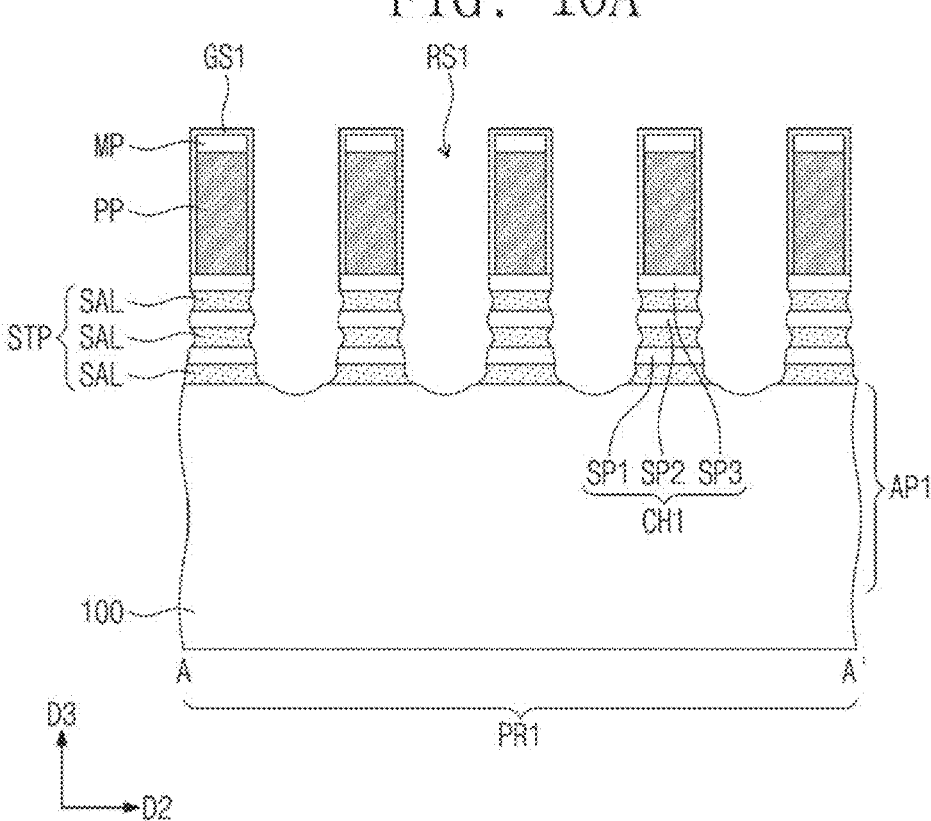
Figure 10B:
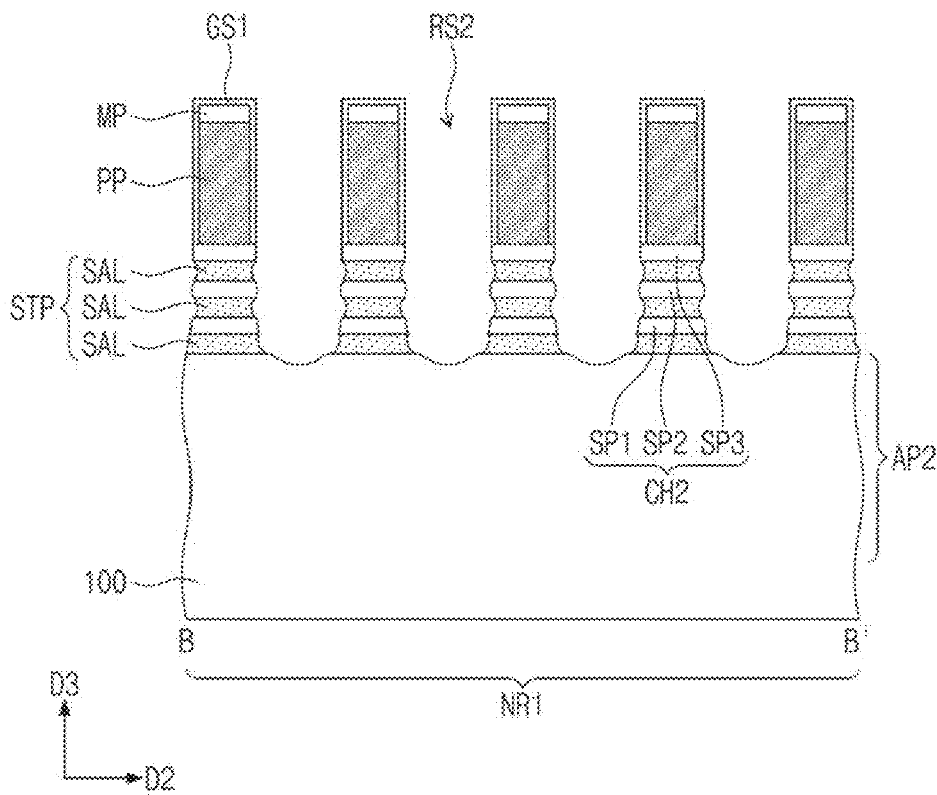
Figure 10C:
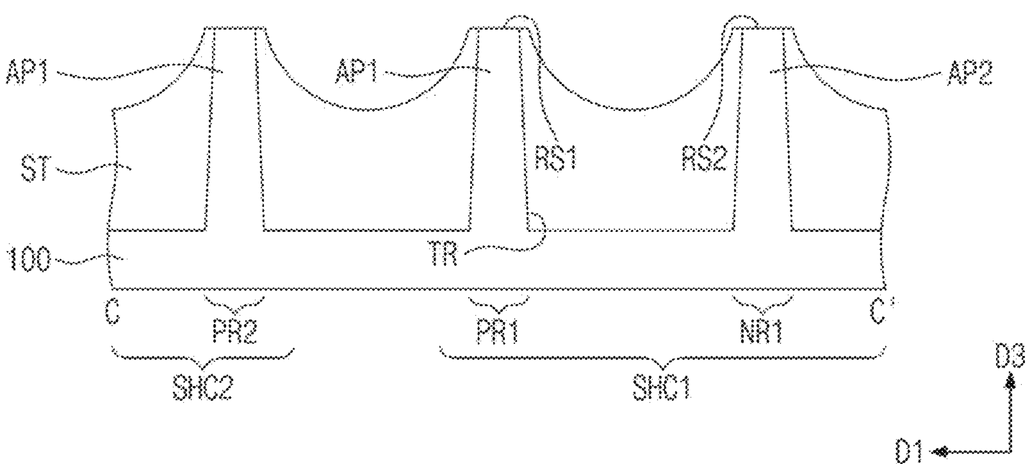

Referring to FIGS. 10A to 10C, the first spacer GS1 may be formed on the sacrificial patterns PP. The first spacer GS1 may cover or at least partially cover the sacrificial pattern PP and the hard mask pattern MP. The first spacer GS1 may be formed of silicon nitride (SiN) or carbon-containing silicon nitride (SiCN). The formation of the first spacer GS1 may be performed using an atomic layer deposition (ALD) process or a chemical vapor deposition (CVD) process.

The first recesses RS1 may be formed in the stacking pattern STP on the first active pattern AP1. The second recesses RS2 may be formed in the stacking pattern STP on the second active pattern AP2. During the formation of the first and second recesses RS1 and RS2, the device isolation layer ST may also be recessed at both sides of each of the first and second active patterns AP1 and AP2 (e.g., see FIG. 10C).

The first recesses RS1 may be formed by etching the stacking pattern STP on the first active pattern AP1 using the first spacer GS1 as an etch mask. The first recess RS1 may be formed between a pair of the sacrificial patterns PP. The second recesses RS2 may be formed by etching the stacking pattern STP on the second active pattern AP2 using the first spacer GS1 as an etch mask. The second recess RS2 may be formed between a pair of the sacrificial patterns PP. The first and second recesses RS1 and RS2 may be formed at the same time using the same process. The first and second recesses RS1 and RS2 may be formed to have substantially the same shape and size.

The sacrificial layers SAL may be exposed through the first and second recesses RS1 and RS2. In an embodiment, a selective etching process may be performed on the exposed sacrificial layers SAL. The etching process may include a wet etching process of removing only silicon-germanium selectively. As a result of the etching process, each of the sacrificial layers SAL may be indented to form an indent region. Due to the presence of the indent region, a side surface of the sacrificial layer SAL may become concave. Due to the presence of the indent region, each of the first and second recesses RS1 and RS2 may have an uneven or embossing side surface.

The first to third semiconductor patterns SP1, SP2, and SP3, which are sequentially stacked between adjacent ones of the first recesses RS1, may be respectively formed from the active layers ACL. The first to third semiconductor patterns SP1, SP2, and SP3, which are sequentially stacked between adjacent ones of the second recesses RS2, may be respectively formed from the active layers ACL. The first to third semiconductor patterns SP1, SP2, and SP3 between adjacent ones of the first recesses RS1 may constitute the first channel pattern CH1. The first to third semiconductor patterns SP1, SP2, and SP3 between adjacent ones of the second recesses RS2 may constitute the second channel pattern CH2.

Figure 11A:
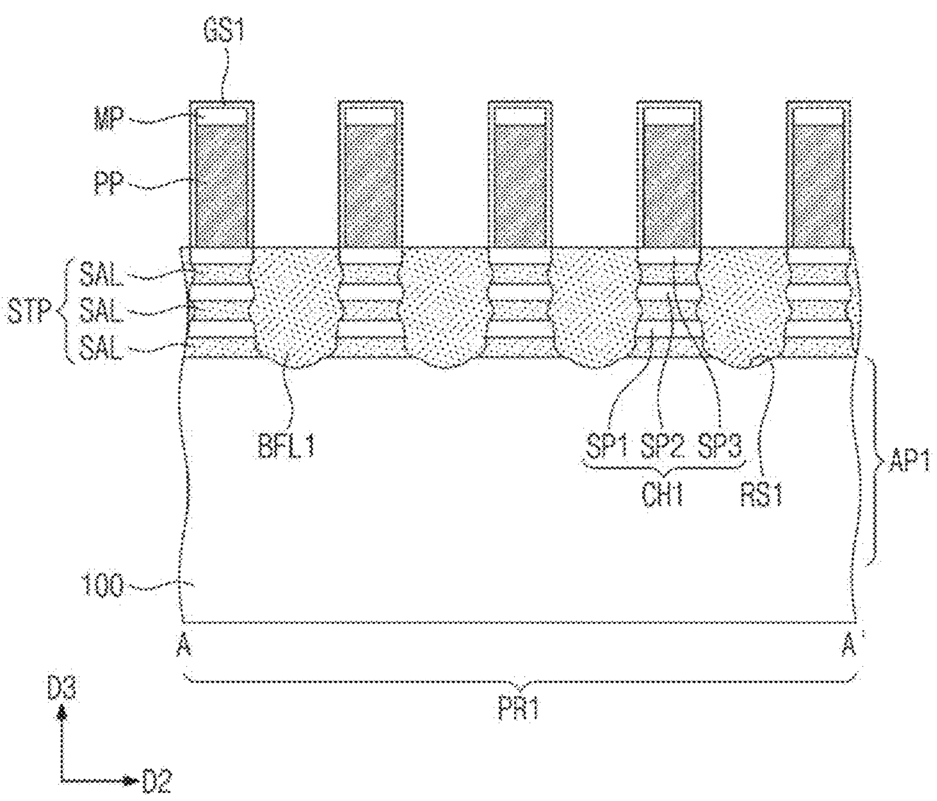
Figure 11B:
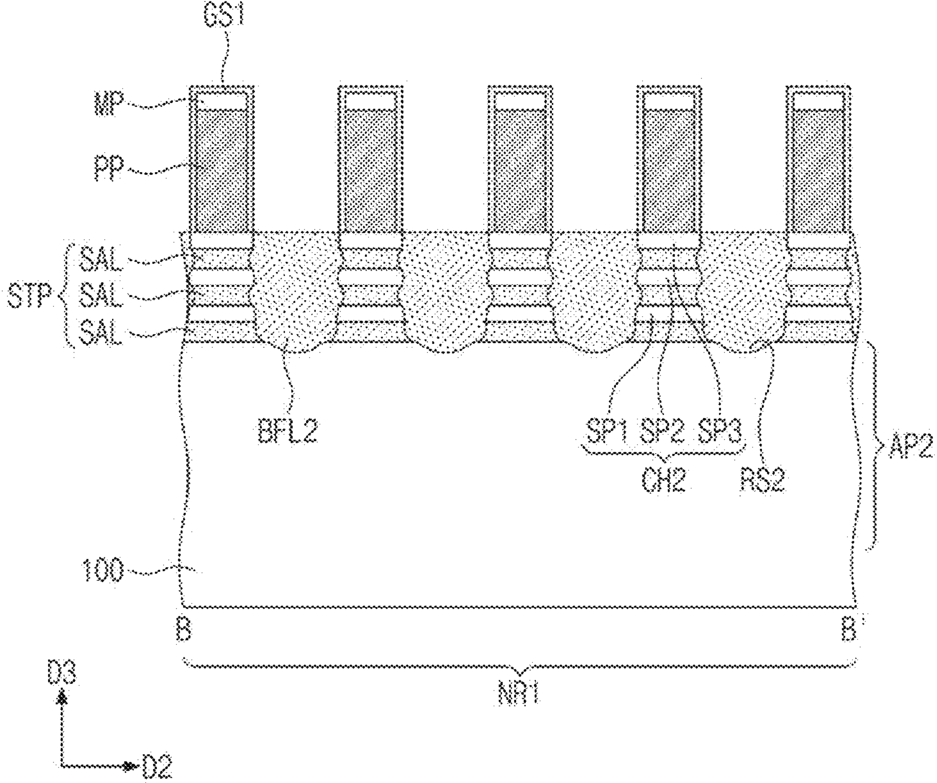
Figure 11C:
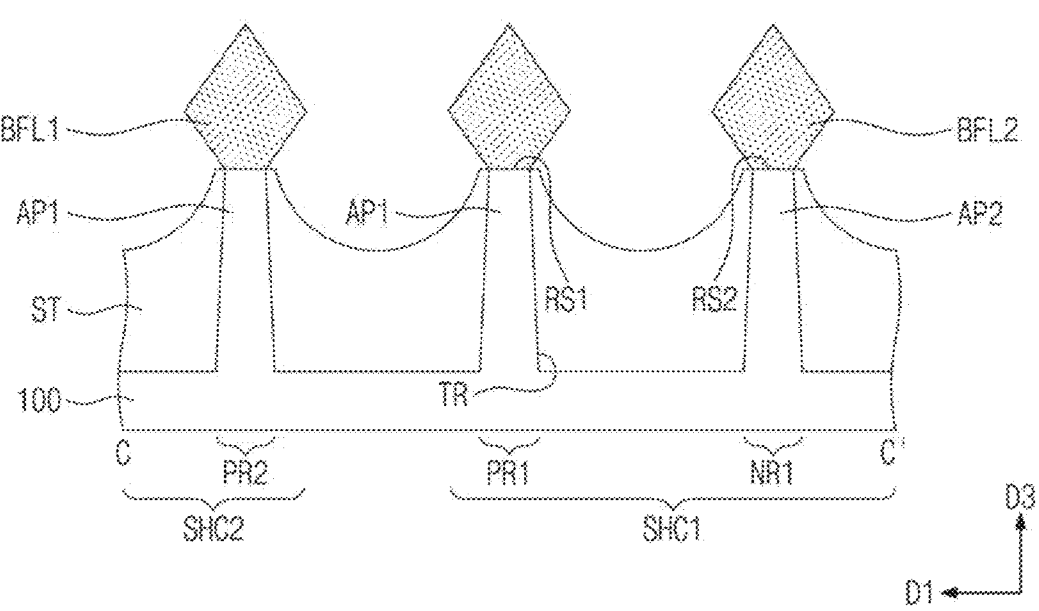

Referring to FIGS. 11A to 11C, the first buffer layer BFL1 may be formed in the first recess RS1. The first buffer layer BFL1 may be formed to fill the first recess RS1. The second buffer layer BFL2 may be formed in the second recess RS2. The second buffer layer BFL2 may be formed to fill the second recess RS2.

A first SEG process, in which inner side surfaces of the first and second recesses RS1 and RS2 are used as a seed layer, may be performed to form the first and second buffer layers BFL1 and BFL2, respectively. The first and second buffer layers BFL1 and BFL2 may be grown using the first to third semiconductor patterns SP1, SP2, and SP3 and the sacrificial layers SAL as a seed. The first and second buffer layers BFL1 and BFL2 may be formed simultaneously through the first SEG process. As an example, the first SEG process may be performed using a CVD process or a molecular beam epitaxy (MBE) process.

The first and second buffer layers BFL1 and BFL2 may be formed of or include a semiconductor material (e.g., SiGe) with a lattice constant that is larger than that of the substrate 100. The first and second buffer layers BFL1 and BFL2 may contain a relatively low concentration of germanium (Ge). In an embodiment, the first and second buffer layers BFL1 and BFL2 may contain only silicon (Si), but not germanium (Ge). A germanium concentration in the first buffer layer BFL1 may range from 0 at % to 10 at %, in particular, from 2 at % to 30 at %.

Figure 12A:
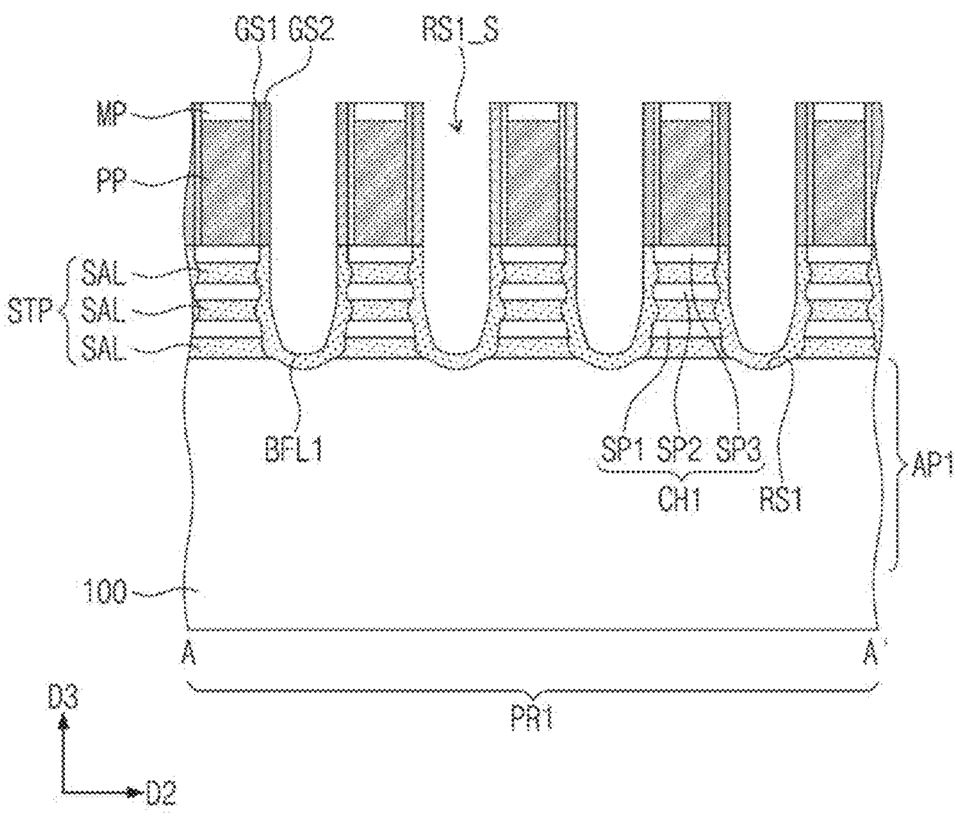
Figure 12B:
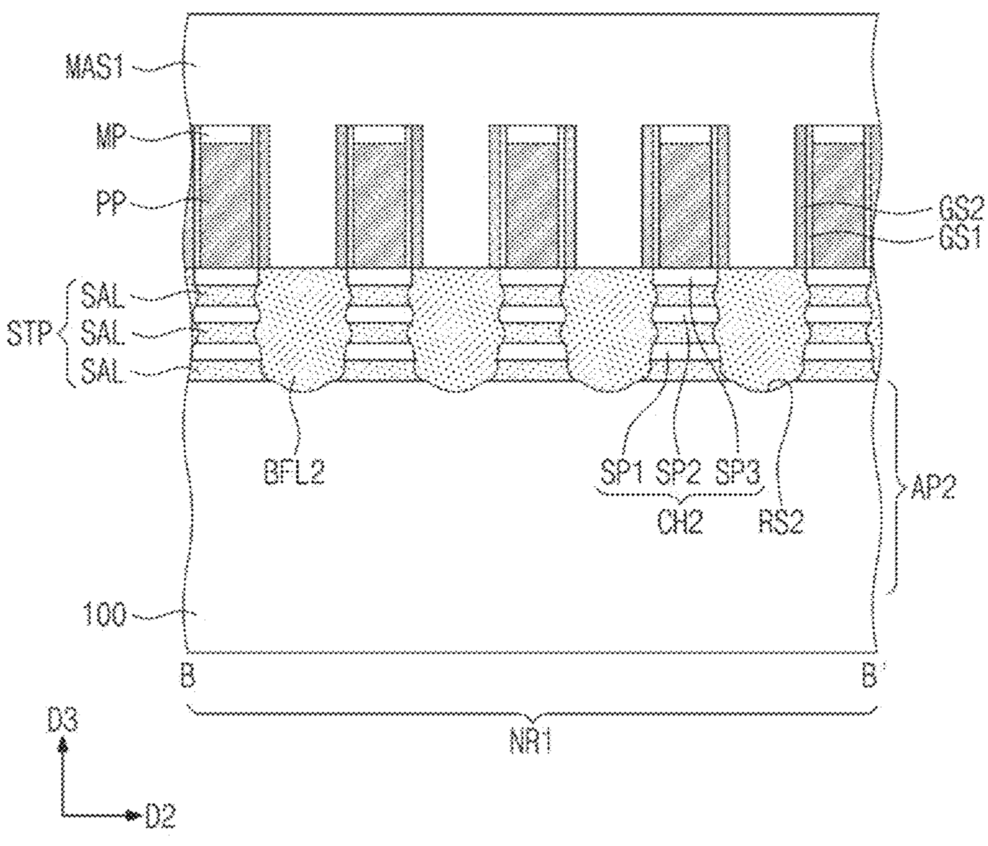
Figure 12C:
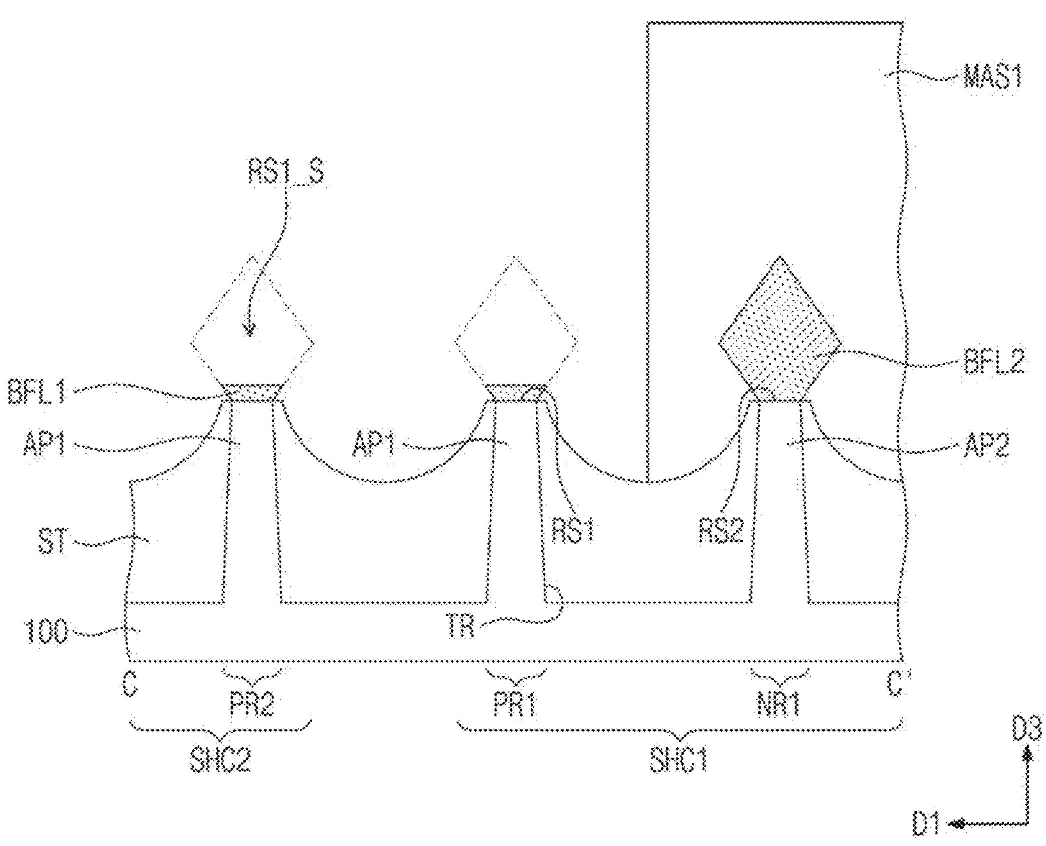

Referring to FIGS. 12A to 12C, the second spacer GS2 may be formed on the first spacer GS1. The second spacer GS2 may be formed to directly contact and cover or at least partially cover a side surface of the first spacer GS1. The second spacer GS2 may be formed of a Si-containing low-k dielectric material (e.g., SiCON). The second spacer GS2 may be formed to be thicker than the first spacer GS1. The formation of the second spacer GS2 may include forming a spacer layer using an ALD or CVD process and anisotropically etching the spacer layer.

A first mask layer MAS1 may be formed to selectively cover or at least partially cover the NMOSFET regions NR1 and NR2. The first mask layer MAS1 may be formed to expose the PMOSFET regions PR1 and PR2.

An etching process may be performed on the first buffer layer BFL1 in the exposed PMOSFET regions PR1 and PR2. The etching process may be performed using the first mask layer MAS1 and the second spacer GS2 as an etch mask. Thus, the first buffer layer BFL1 may be partially etched, and as a result, a first sub-recess RS1_S may be formed in the first buffer layer BFL1. The NMOSFET regions NR1 and NR2 may be protected from the etching process by the first mask layer MAS1.

Figure 13A:
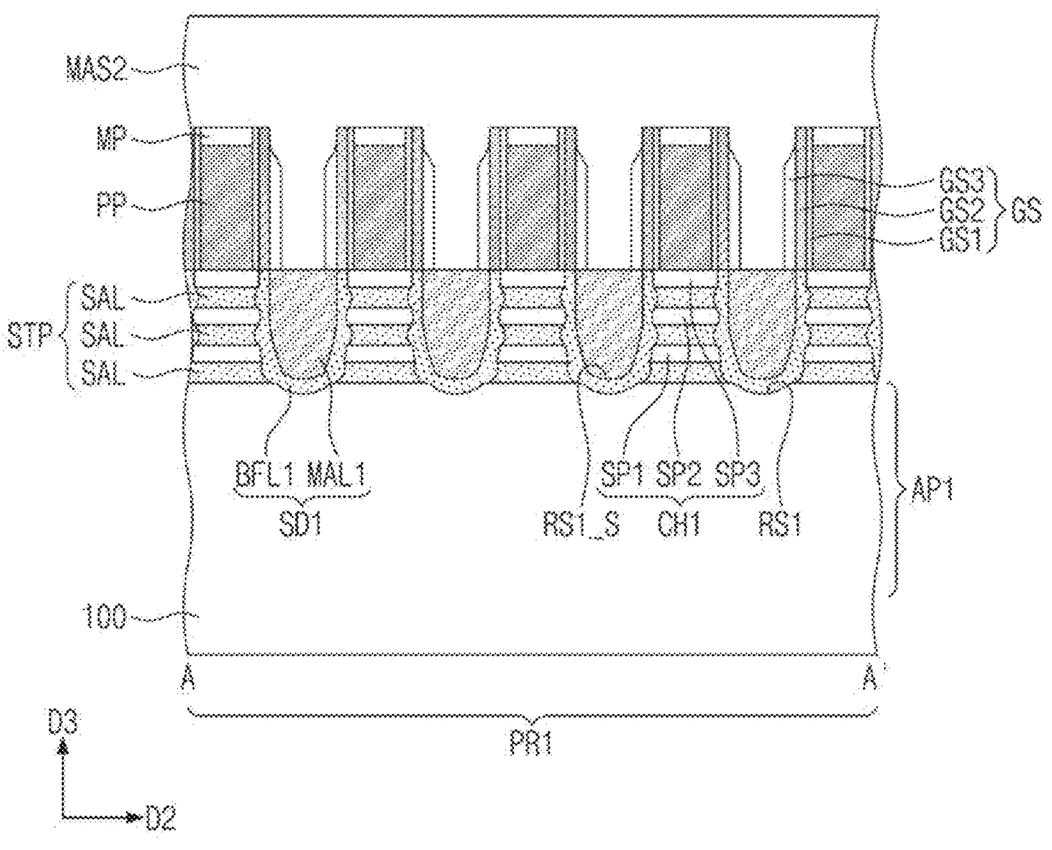
Figure 13B:
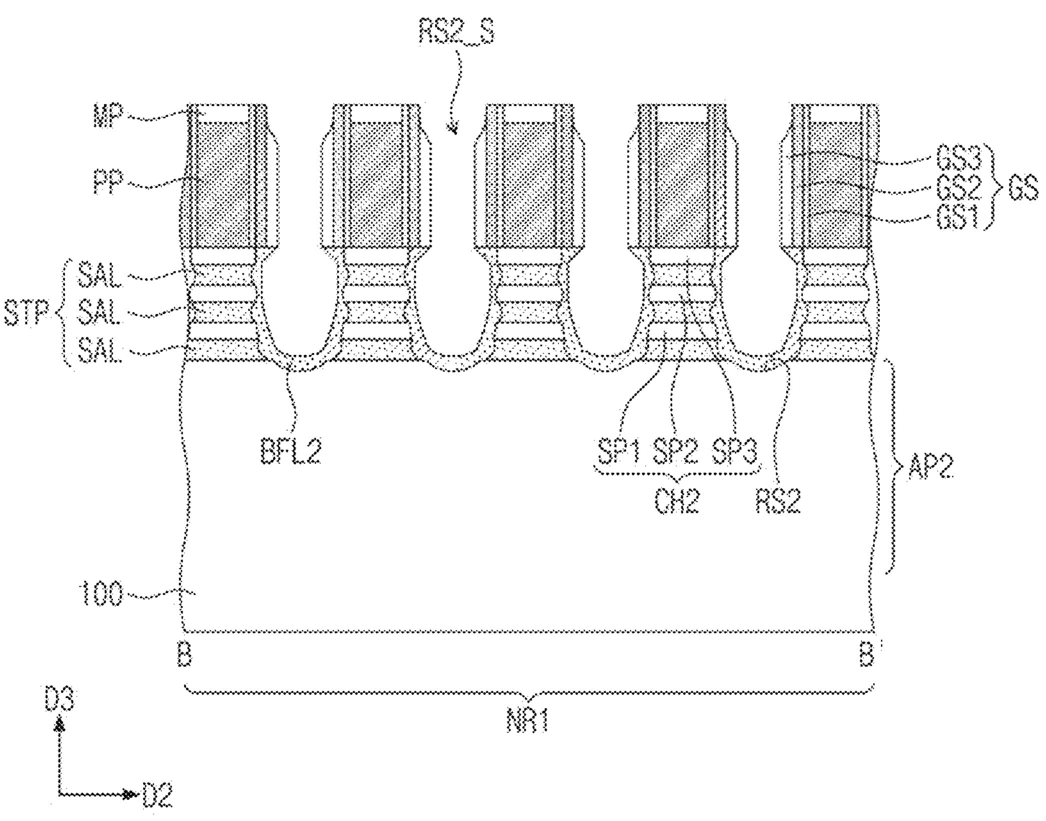
Figure 13C:
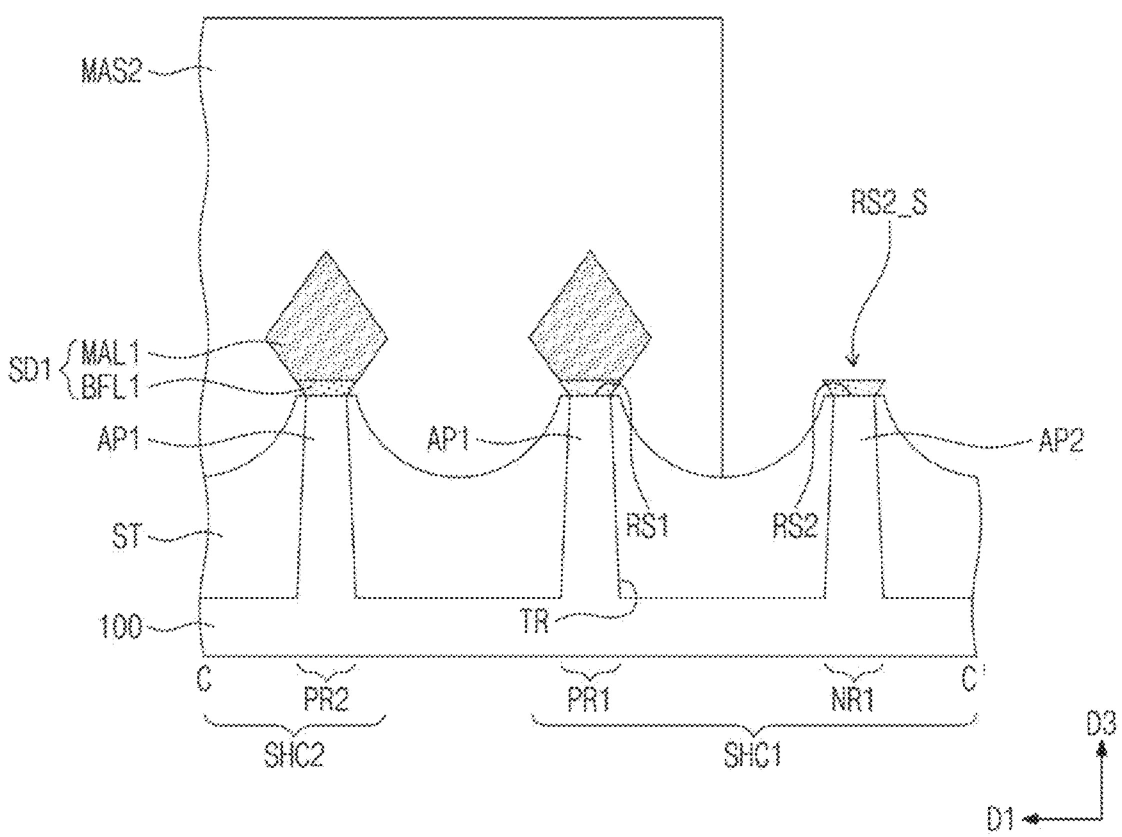

Referring to FIGS. 13A to 13C, the first main layer MAL1 may be formed in the first sub-recess RS1_S. The first main layer MAL1 may be formed to fill the first sub-recess RS1_S.

The first main layer MAL1 may be formed by performing a second SEG process using an inner side surface of the first buffer layer BFL1 as a seed layer. The first main layer MAL1 may be formed of or include a semiconductor material (e.g., SiGe) with a lattice constant that is greater than that of the substrate 100. The first main layer MAL1 may contain a relatively high concentration of germanium (Ge). As an example, the germanium concentration in the first main layer MAL1 may range from 30 at % to 70 at %. The first main layer MAL1 may be formed to have a germanium concentration gradually increasing in the third direction D3 (e.g., see FIG. 6A). An impurity (e.g., boron, gallium, or indium) may be injected into the first buffer layer BFL1 and the first main layer MAL1 to enable the first source/drain pattern SD1 to have a p-type conductivity.

The first mask layer MAS1 may be removed. The third spacer GS3 may be formed on the second spacer GS2. The third spacer GS3 may directly contact and cover or at least partially cover a side surface of the second spacer GS2. The third spacer GS3 may be formed of or include silicon oxide (SiO), silicon oxynitride (SiON), or silicon nitride (SiN). The third spacer GS3 may be formed to be thicker than the second spacer GS2. The formation of the third spacer GS3 may include forming a spacer layer using an atomic layer deposition (ALD) or chemical vapor deposition (CVD) process and anisotropically etching the spacer layer.

A second mask layer MAS2 may be formed to selectively cover or at least partially cover only the PMOSFET regions PR1 and PR2. The second mask layer MAS2 may be formed to expose the NMOSFET regions NR1 and NR2.

An etching process may be performed on the second buffer layer BFL2 in the exposed NMOSFET regions NR1 and NR2. The etching process may be performed using the second mask layer MAS2 and the third spacer GS3 as an etch mask. The second buffer layer BFL2 may be partially etched to form a second sub-recess RS2_S in the second buffer layer BFL2. The PMOSFET regions PR1 and PR2 may be protected by the second mask layer MAS2 during the etching process.

The formation of the second sub-recess RS2_S may include sequentially performing an anisotropic etching process and an isotropic etching process. As a result of the isotropic etching process, the first and second facet surfaces FA1 and FA2 may be formed in an upper portion of the second main layer MAL2, as previously described with reference to FIG. 6B. As a result of the isotropic etching process, a size of the second sub-recess RS2_S may be larger than a size of the first sub-recess RS1_S.

Figure 14A:
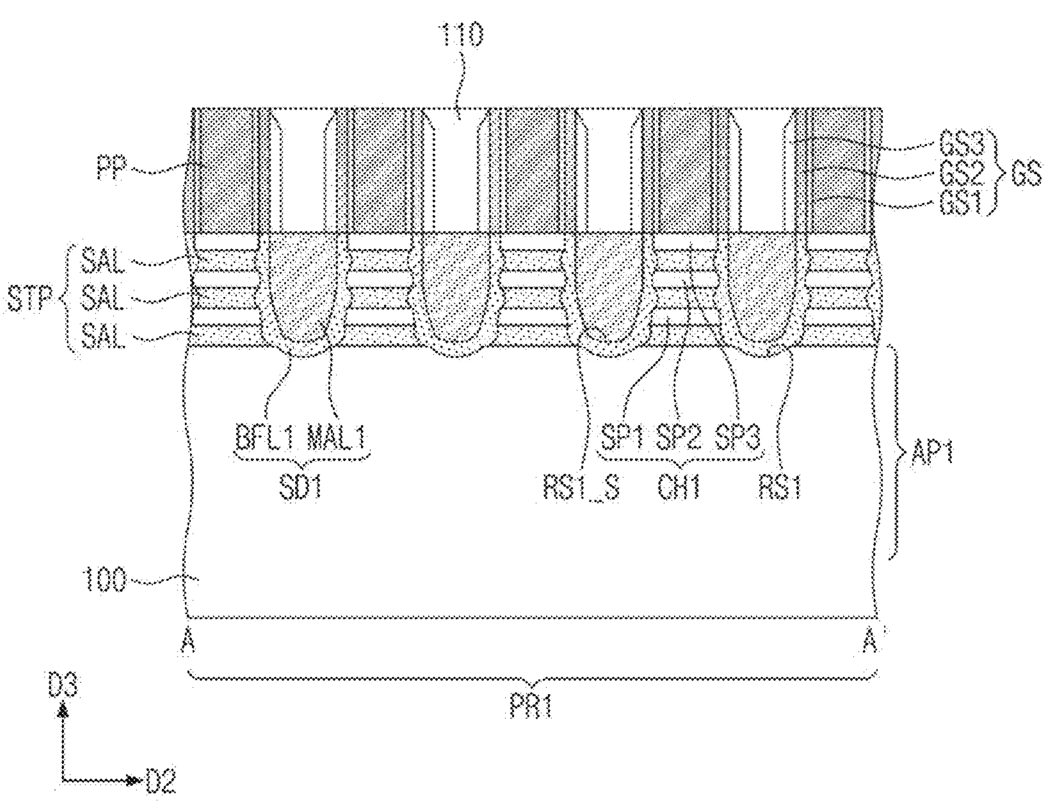
Figure 14B:
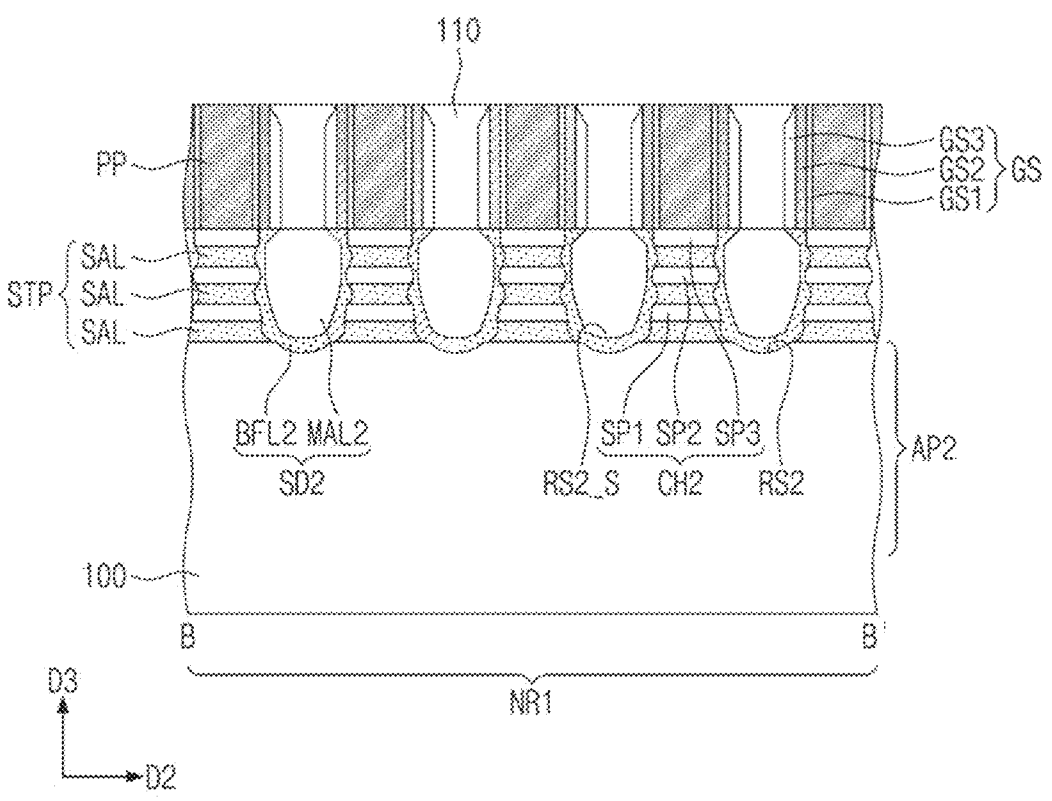
Figure 14C:
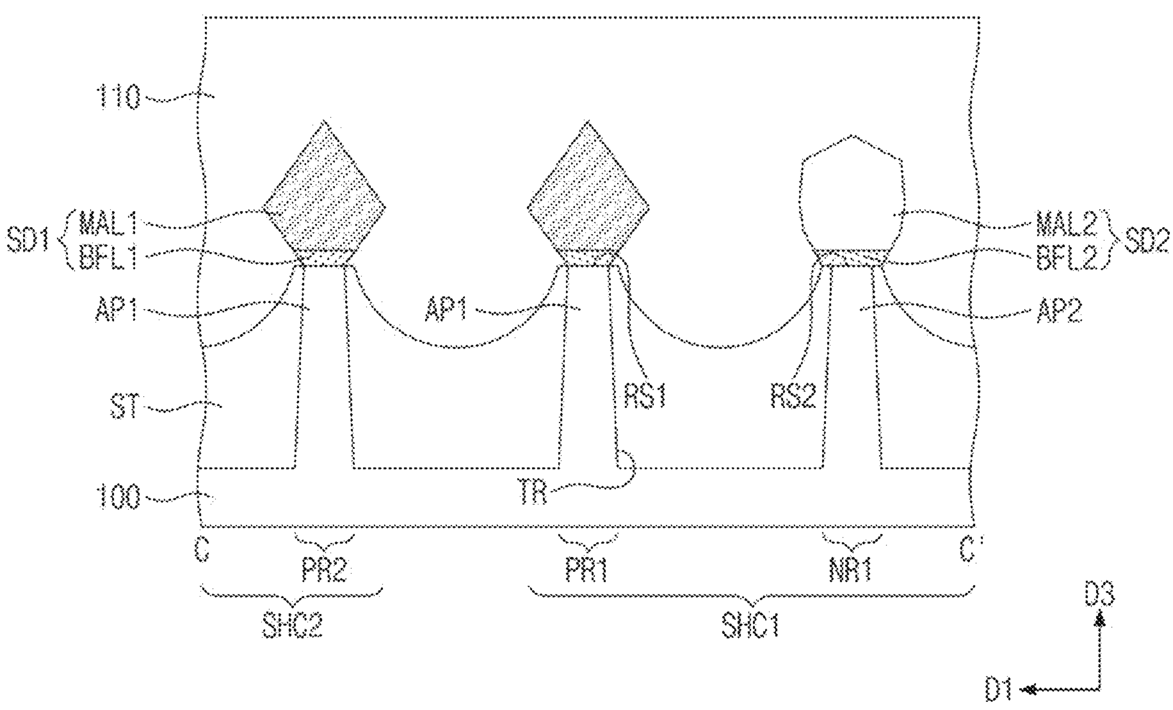

Referring to FIGS. 14A to 14C, the second main layer MAL2 may be formed in the second sub-recess RS2_S. The second main layer MAL2 may be formed to fill the second sub-recess RS2_S.

The second main layer MAL2 may be formed by performing a third SEG process using an inner side surface of the second buffer layer BFL2 as a seed layer. The second main layer MAL2 may be formed of or include the same semiconductor element (e.g., Si) as the substrate 100. A silicon concentration in the second main layer MAL2 may range from 90 at % to 100 at %. Impurities (e.g., phosphorus, arsenic, or antimony) may be injected into the second buffer layer BFL2 and the second main layer MAL2 to enable the second source/drain pattern SD2 to have an n-type conductivity. Thereafter, the second mask layer MAS2 may be removed.

The first interlayer insulating layer 110 may be formed to cover or at least partially cover the first and second source/drain patterns SD1 and SD2, the hard mask patterns MP, and the gate spacers GS. In an embodiment, the first interlayer insulating layer 110 may include a silicon oxide layer.

The first interlayer insulating layer 110 may be planarized to expose the top surfaces of the sacrificial patterns PP. The planarization of the first interlayer insulating layer 110 may be performed using an etch-back or chemical-mechanical polishing (CMP) process. All of the hard mask patterns MP may be removed during the planarization process. Accordingly, the first interlayer insulating layer 110 may have a top surface that is coplanar with the top surfaces of the sacrificial patterns PP and the top surfaces of the gate spacers GS.

Figure 15A:
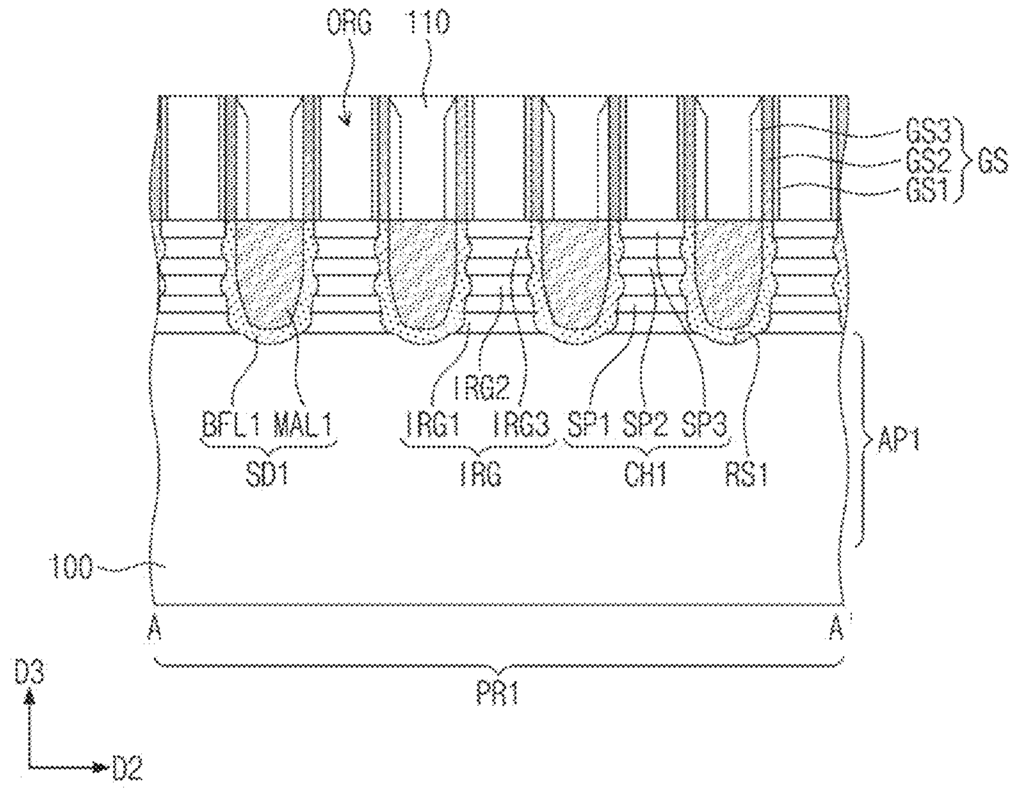
Figure 15B:
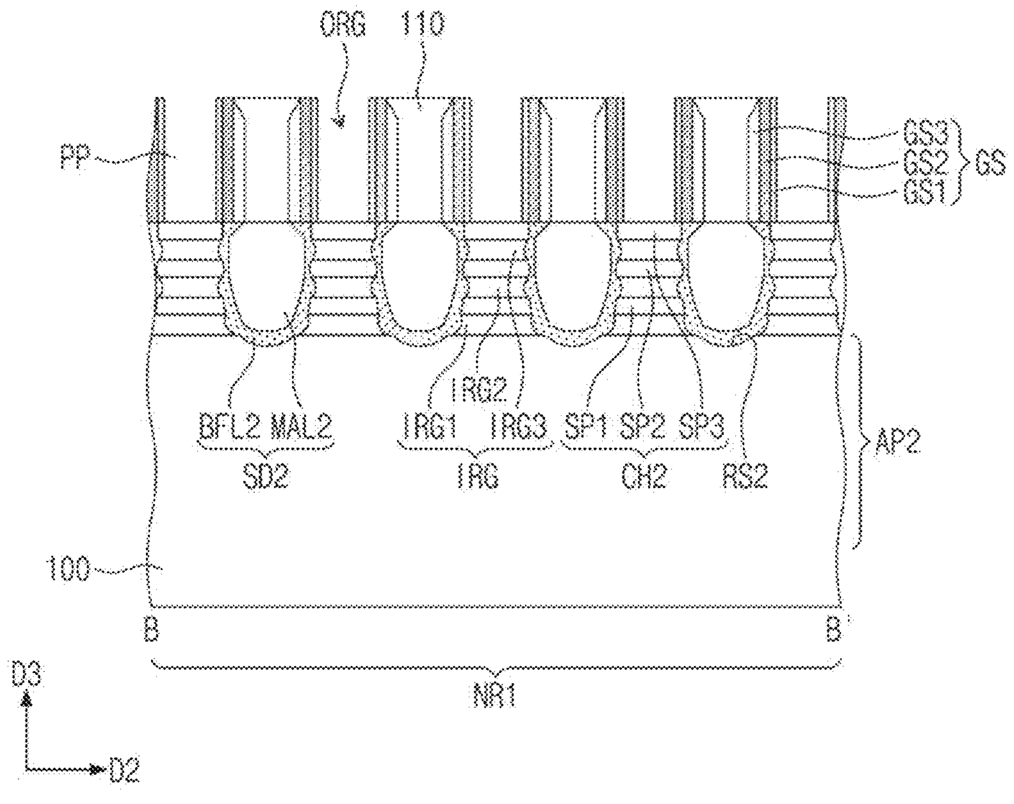
Figure 15C:
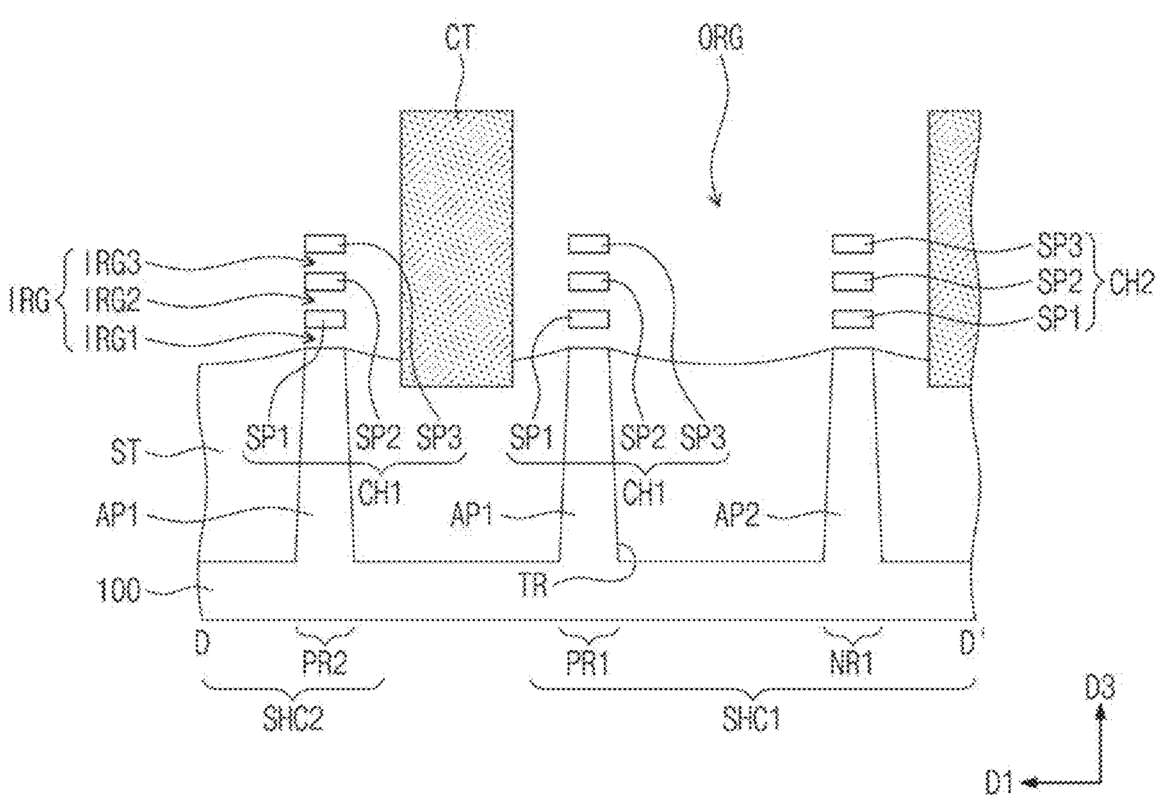

Referring to FIGS. 15A to 15C, a photolithography process may be performed to selectively open a region of the sacrificial pattern PP. For example, a region of the sacrificial pattern PP on the third and fourth borders BD3 and BD4 of the first single height cell SHC1 may be selectively opened. The opened region of the sacrificial pattern PP may be selectively etched and removed. The gate cutting pattern CT may be formed by filling a space, which is formed by removing the sacrificial pattern PP, with an insulating material (e.g., see FIG. 15C).

In an embodiment, the exposed sacrificial patterns PP may be selectively removed. As a result of the removal of the sacrificial patterns PP, an outer region ORG exposing the first and second channel patterns CH1 and CH2 may be formed (e.g., see FIG. 15C). The removal of the sacrificial patterns PP may include a wet etching process which is performed using etching solution capable of selectively etching polysilicon.

The sacrificial layers SAL, which are exposed through the outer region ORG, may be selectively removed to form inner regions IRG (e.g., see FIG. 15C). By performing a process of selectively etching the sacrificial layers SAL, the first to third semiconductor patterns SP1, SP2, and SP3 may be left and only the sacrificial layers SAL may be removed. An etch recipe for the etching process may be chosen to etch a layer (e.g., a silicon germanium layer), which is formed to have a relatively high germanium concentration, at a high etch rate. For example, the etching process may be chosen to have a high etch rate to a silicon germanium layer whose germanium concentration is higher than 10 at %.

The sacrificial layers SAL on the first and second PMOSFET regions PR1 and PR2 and the first and second NMOSFET regions NR1 and NR2 may be removed during the etching process. The etching process may be a wet etching process. An etchant material, which is used in the etching process, may be chosen to quickly remove the sacrificial layer SAL having a relatively high germanium concentration. During the etching process, the first and second source/drain patterns SD1 and SD2 may be protected due to the first and second buffer layers BFL1 and BFL2 having a relatively low concentration of germanium. In particular, since, as previously described with reference to FIG. 7, the side portion of the first buffer layer BFL1 is formed to be sufficiently thick, the etching material may be prevented from entering the first main layer MAL1.

Referring back to FIG. 15C, since the sacrificial layers SAL are selectively removed, only the first to third semiconductor patterns SP1, SP2, and SP3, which are stacked on each of the first and second active patterns AP1 and AP2, may be left. Empty regions, which are formed by removing the sacrificial layers SAL, may form first to third inner regions IRG1, IRG2, and IRG3, respectively.

The first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Figure 16A:
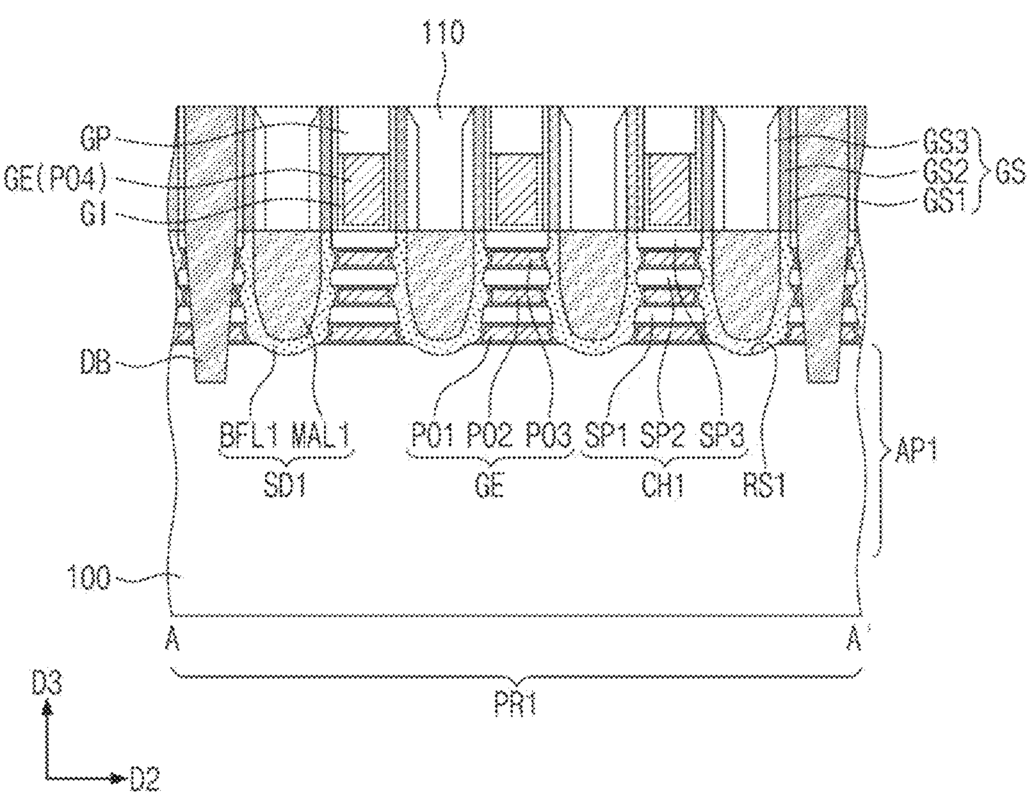
Figure 16B:
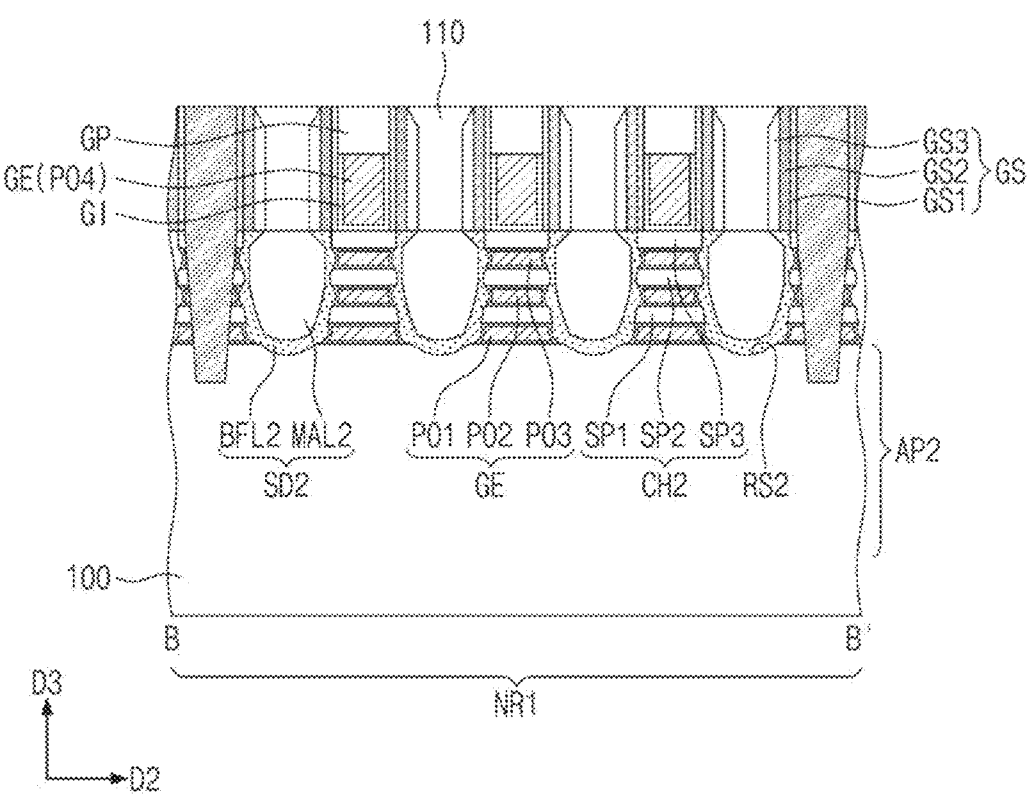
Figure 16C:
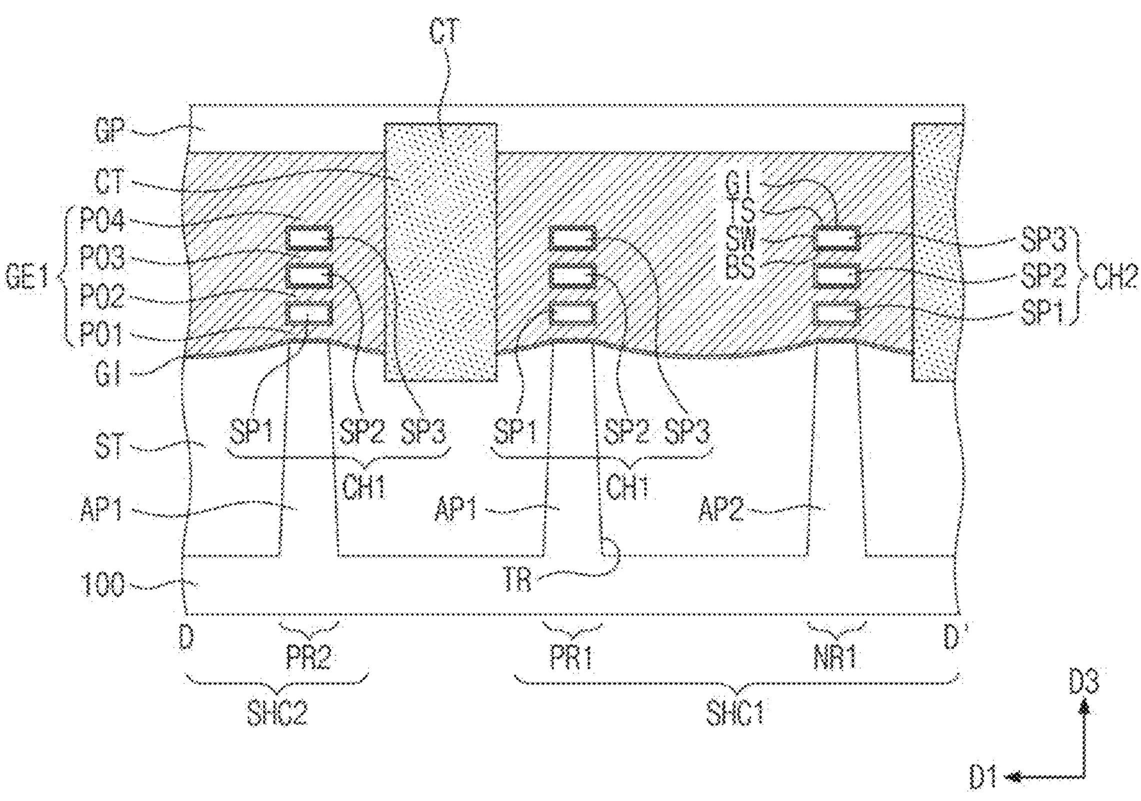

Referring to FIGS. 16A to 16C, the gate insulating layer GI may be conformally formed on the exposed first to third semiconductor patterns SP1, SP2, and SP3. The gate electrode GE may be formed on the gate insulating layer GI. The gate electrode GE may include the first to third inner electrodes PO1, PO2, and PO3, which are respectively formed in the first to third inner regions IRG1, IRG2, and IRG3, and the outer electrode PO4, which is formed in the outer region ORG.

The gate electrode GE may be recessed to have a reduced height. During the recessing of the gate electrode GE, an upper portion of the gate cutting pattern CT may also be slightly recessed. The gate capping pattern GP may be formed on the recessed gate electrode GE.

A pair of the division structures DB may be formed at both sides of each of the first and second single height cells SHC1 and SHC2. The division structure DB may be formed to penetrate the gate capping pattern GP and the gate electrode GE and may extend into the active pattern AP1 or AP2. The division structure DB may be formed of or include at least one of insulating materials (e.g., silicon oxide or silicon nitride).

Referring to FIGS. 5A to 5D, the second interlayer insulating layer 120 may be formed on the first interlayer insulating layer 110. The second interlayer insulating layer 120 may include a silicon oxide layer. The active contacts AC may be formed to penetrate the second interlayer insulating layer 120 and the first interlayer insulating layer 110 and to be electrically connected to the first and second source/drain patterns SD1 and SD2.

The formation of the active contact AC may include forming a contact hole in a self-aligned manner using the gate spacer GS, forming the barrier metal BM in the contact hole, and forming the filler metal FM on the barrier metal BM. The barrier metal BM may be conformally formed and may include a metal layer and a metal nitride layer. The filler metal FM may be formed of or include at least one of low resistance metals.

The third interlayer insulating layer 130 may be formed on the second interlayer insulating layer 120. The gate contact GC may be formed to penetrate the third interlayer insulating layer 130, the second interlayer insulating layer 120, and the gate capping pattern GP and may be connected to the gate electrode GE. The first via VI1 may be formed to penetrate the third interlayer insulating layer 130 and may be connected to the active contact AC. In an embodiment, the gate contact GC and the first via VI1 may be formed together.

The first metal layer M1 may be formed in the third interlayer insulating layer 130. The interconnection lines M1_R1, M1_R2, M1_R3, and M1_I, which are respectively connected to the gate contact GC and the first via VI1, may be formed in an upper portion of the third interlayer insulating layer 130. The fourth interlayer insulating layer 140 may be formed on the third interlayer insulating layer 130. The second metal layer M2 may be formed in the fourth interlayer insulating layer 140.

Figure 17:
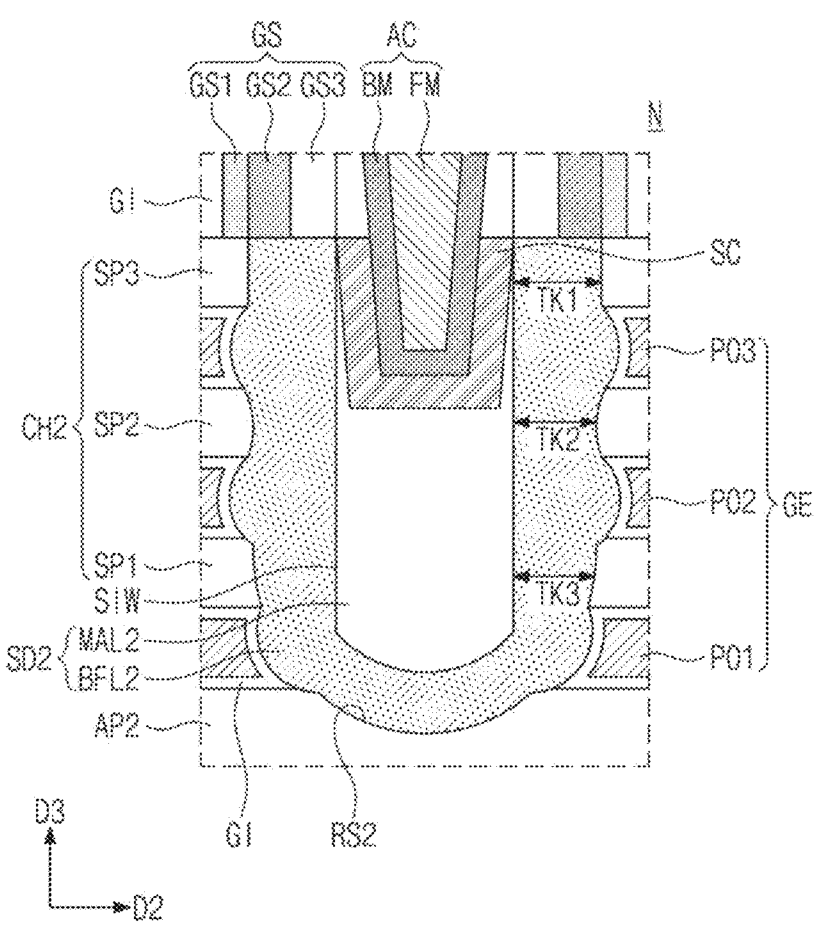
FIG. 17 is an enlarged cross-sectional view illustrating a portion of a semiconductor device according to an embodiment of the disclosure.

FIG. 17 is an enlarged cross-sectional view illustrating a portion (e.g., 'N' of FIG. 5B) of a semiconductor device according to an embodiment of the disclosure. In the following description, repeated descriptions of aspects described above may be omitted.

Referring to FIG. 17, the second main layer MAL2 may have a size or volume that is smaller than the first main layer MAL1 of FIG. 6A. A side surface SIW of the second main layer MAL2 may be substantially parallel to the third direction D3. The side surface SIW of the second main layer MAL2 may be vertically aligned to a side surface of the third spacer GS3. Owing to the side surface SIW of the second main layer MAL2, the first to third thicknesses TK1 to TK3 may have similar values to each other.

In example embodiments, the second main layer MAL2 may be formed by performing only the anisotropic etching process, when the second sub-recess RS2_S described with reference to FIGS. 13A to 13C is formed. That is, since the isotropic etching process may be omitted, a side surface of the second sub-recess RS2_S may be formed to be vertically aligned to the side surface of the third spacer GS3. Since the isotropic etching process is omitted, the first and second facet surfaces FA1 and FA2 in the upper portion of the second main layer MAL2 may be omitted.

In a semiconductor device according to an embodiment of the disclosure, a first buffer layer of a source/drain pattern of a PMOSFET and a second buffer layer of a source/drain pattern of an NMOSFET may be provided to have the same structure and include the same material. Thus, the proximity between the source/drain pattern of the PMOSFET and a gate electrode may be substantially the same as the proximity between the source/drain pattern of the NMOSFET and the gate electrode. Thus, according to an embodiment of the disclosure, the performance of the semiconductor device (in particular, the performance of the NMOSFET) may be improved and a process failure, which may occur in the PMOSFET, may be prevented.

Each of the embodiments provided in the above description is not excluded from being associated with one or more features of another example or another embodiment also provided herein or not provided herein but consistent with the disclosure While the disclosure has been particularly shown and described with reference to embodiments thereof, it will be understood that various changes in form and details may be made therein without departing from the spirit and scope of the following claims.

What is claimed is:

1. A semiconductor device, comprising:
- a substrate comprising a p-type metal-oxide-semiconductor (MOS) field-effect transistor (FET) (PMOSFET) region and an n-type MOSFET (NMOSFET) region;
- a first active pattern on the PMOSFET region;
- a second active pattern on the NMOSFET region;
- a first channel pattern and a first source/drain pattern on the first active pattern, the first channel pattern connected to the first source/drain pattern;
- a second channel pattern and a second source/drain pattern provided on the second active pattern, the second channel pattern connected to the second source/drain pattern; and
- a gate electrode on the first channel pattern and the second channel pattern,
- wherein the first source/drain pattern comprises a first buffer layer and a first main layer on the first buffer layer,
- wherein the second source/drain pattern comprises a second buffer layer and a second main layer on the second buffer layer,
- wherein each of the first buffer layer and the second buffer layer comprises silicon-germanium (SiGe),
- wherein a germanium concentration in each of the first buffer layer and the second buffer layer is in a range from 2 at % to 30 at %,
- wherein a germanium concentration of the first source/drain pattern increases in a first direction that is away from the substrate, and
- wherein a germanium concentration in the second source/drain pattern decreases in the first direction.

2. The semiconductor device of claim 1, wherein the first main layer comprises silicon-germanium (SiGe), and
- wherein a germanium concentration in the first main layer is higher than the germanium concentration in the first buffer layer.

3. The semiconductor device of claim 1, wherein the second main layer comprises silicon, and
- wherein the germanium concentration in the second buffer layer is higher than a germanium concentration in the second main layer.

4. The semiconductor device of claim 1, wherein the first buffer layer comprises a first impurity comprising at least one of boron, gallium, and indium, and
- wherein the second buffer layer comprises a second impurity comprising at least one of phosphorus, arsenic, and antimony.

5. The semiconductor device of claim 1, further comprising:
- a gate insulating layer between the gate electrode and each of the first and second channel patterns; and
- a gate spacer on a side surface of the gate electrode,
- wherein the gate insulating layer is between the gate electrode and the gate spacer, and
- wherein a first horizontal distance between the gate insulating layer and a first upper side surface of the first buffer layer is equal to a second horizontal distance between the gate insulating layer and a second upper side surface of the second buffer layer.

6. The semiconductor device of claim 1, wherein the second main layer comprises an upper portion comprising at least one facet surface, and
- wherein the at least one facet surface is a {111} plane.

7. The semiconductor device of claim 1, wherein the second channel pattern comprises a first semiconductor pattern, a second semiconductor pattern, and a third semiconductor pattern spaced apart from each other,
- wherein the second buffer layer comprises a first thickness between the third semiconductor pattern and the second main layer,
- wherein the second buffer layer comprises a second thickness between the second semiconductor pattern and the second main layer,
- wherein the second buffer layer comprises a third thickness between the first semiconductor pattern and the second main layer, and
- wherein each of the first thickness, the second thickness and the third thickness are different from each other.

8. The semiconductor device of claim 7, wherein the third thickness is larger than the second thickness, and
- wherein the first thickness is larger than the third thickness.

9. The semiconductor device of claim 1, further comprising a gate spacer on a side surface of the gate electrode,
- wherein a side portion of the first buffer layer contacts the gate spacer, and
- wherein a ratio of a thickness of the side portion of the first buffer layer to a thickness of a center portion of the first buffer layer is in a range from 0.7 to 1.

10. A semiconductor device, comprising:
- a substrate comprising an n-type metal-oxide-semiconductor (MOS) field-effect transistor (FET) (NMOSFET) region;
- an active pattern on the NMOSFET region;
- a channel pattern on the active pattern, the channel pattern comprising a plurality of semiconductor patterns spaced apart from each other;
- a source/drain pattern on the active pattern;
- a gate electrode on the channel pattern, the gate electrode comprising:
  - an inner electrode between adjacent semiconductor patterns of the plurality of semiconductor patterns; and
  - an outer electrode on a uppermost semiconductor pattern of the plurality of semiconductor patterns;
- a gate insulating layer between the gate electrode and each of the plurality of semiconductor patterns;
- a gate spacer on a side surface of the outer electrode;
- a gate capping pattern on a top surface of the outer electrode;
- an interlayer insulating layer on the gate capping pattern and the source/drain pattern;
- a gate contact penetrating the interlayer insulating layer and the gate capping pattern, the gate contact connected to the gate electrode;
- an active contact penetrating the interlayer insulating layer and connected to the source/drain pattern;
- a first metal layer on the interlayer insulating layer, the first metal layer comprising a plurality of first interconnection lines respectively connected to the gate contact and the active contact; and
- a second metal layer on the first metal layer,
- wherein the second metal layer comprises a plurality of second interconnection lines connected to the first metal layer, wherein the source/drain pattern comprises a buffer layer and a main layer on the buffer layer, wherein the main layer comprises an upper portion comprising at least one facet surface, wherein the at least one facet surface is a {111} plane, and wherein the buffer layer at least partially covers the at least one facet surface.

11. The semiconductor device of claim 10, wherein the buffer layer comprises silicon-germanium (SiGe), and wherein a germanium concentration in the buffer layer is in a range from 2 at % to 30 at %.

12. The semiconductor device of claim 10, wherein the main layer comprises silicon, and wherein a silicon concentration in the main layer is in a range from 90 at % to 100 at %.

13. The semiconductor device of claim 10, wherein the plurality of semiconductor patterns comprise a first semiconductor pattern, a second semiconductor pattern, and a third semiconductor pattern, which are sequentially stacked, wherein the buffer layer comprises a first thickness between the third semiconductor pattern and the main layer, wherein the buffer layer comprises a second thickness between the second semiconductor pattern and the main layer, wherein the buffer layer comprises a third thickness between the first semiconductor pattern and the main layer, and wherein the first thickness, the second thickness and the third thickness are different from each other.

14. The semiconductor device of claim 13, wherein the third thickness is larger than the second thickness, and wherein the first thickness is larger than the third thickness.

* * * * *